United States Patent
Choi et al.

(10) Patent No.: US 9,494,859 B1
(45) Date of Patent: Nov. 15, 2016

(54) PHOTOSENSITIVE RESIN COMPOSITION AND COLOR FILTER USING THE SAME

(71) Applicant: Samsung SDI Co., Ltd., Yongin-si (KR)

(72) Inventors: Seyoung Choi, Suwon-si (KR); Sooyeon Park, Suwon-si (KR); Haeni Song, Suwon-si (KR); Injae Lee, Suwon-si (KR); Gyuseok Han, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days.

(21) Appl. No.: 15/059,417

(22) Filed: Mar. 3, 2016

(30) Foreign Application Priority Data

Aug. 27, 2015 (KR) .................. 10-2015-0121120

(51) Int. Cl.
  *G02B 5/20* (2006.01)
  *G03F 7/033* (2006.01)
  *G03F 7/00* (2006.01)
  *G03F 7/038* (2006.01)
  *G02B 5/22* (2006.01)

(52) U.S. Cl.
  CPC ............. *G03F 7/0007* (2013.01); *G02B 5/223* (2013.01); *G03F 7/033* (2013.01); *G03F 7/038* (2013.01)

(58) Field of Classification Search
  CPC ...... G03F 7/0007; G03F 7/032; G03F 7/033; G03F 7/038; G02B 5/223
  USPC ............. 430/7, 270.1, 280.1, 281.1
  See application file for complete search history.

(56) References Cited

U.S. PATENT DOCUMENTS

| | | | |
|---|---|---|---|
| 5,998,091 A | 12/1999 | Suzuki | |
| 6,120,973 A * | 9/2000 | Itano | G03F 7/0007 430/285.1 |
| 6,627,364 B2 | 9/2003 | Kiguchi et al. | |
| 8,133,415 B2 | 3/2012 | Yu et al. | |
| 2009/0284698 A1 | 11/2009 | Kim et al. | |
| 2011/0227009 A1* | 9/2011 | Yu | C09D 4/06 252/586 |

FOREIGN PATENT DOCUMENTS

| | | |
|---|---|---|
| JP | 07-140654 | 6/1995 |
| JP | 09-311210 A * | 12/1997 |
| JP | 10-254133 | 9/1998 |
| JP | 2001-033620 | 2/2001 |
| JP | 2003-222996 | 8/2003 |

(Continued)

OTHER PUBLICATIONS

Computer-generated transaltion of JP 09-311210 (Dec. 1997).*

*Primary Examiner* — John A McPherson
(74) *Attorney, Agent, or Firm* — Additon, Higgins & Pendelton, P.A.

(57) ABSTRACT

A photosensitive resin composition includes (A) a binder resin; (B) a photopolymerizable monomer; (C) a photopolymerization initiator; (D) a colorant; and (E) a solvent. The binder resin includes a first binder resin including structural units represented by Chemical Formulae 1 to 4, wherein the substituents are as defined in the specification, and the first binder resin is present in an amount of about 20 wt % to about 90 wt % based on the total amount of the binder resin. A color filter using the photosensitive resin composition is provided.

[Chemical Formula 1]

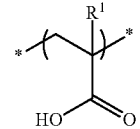

[Chemical Formula 2]

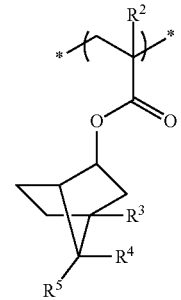

[Chemical Formula 3]

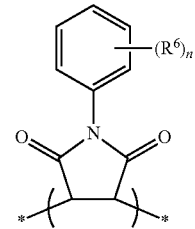

[Chemical Formula 4]

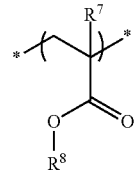

19 Claims, 20 Drawing Sheets

(56) References Cited

FOREIGN PATENT DOCUMENTS

| | | |
|---|---|---|
| JP | 3900078 | 4/2007 |
| JP | 3940523 | 7/2007 |
| JP | 2015-072336 | 4/2015 |
| KR | 10-0994633 | 11/2010 |
| KR | 10-1091535 | 12/2011 |
| KR | 10-1255617 | 4/2013 |
| KR | 10-1261619 | 5/2013 |

* cited by examiner

PHOTOSENSITIVE RESIN COMPOSITION AND COLOR FILTER USING THE SAME

CROSS-REFERENCE TO RELATED APPLICATION

This application claims priority to and the benefit of Korean Patent Application No. 10-2015-0121120 filed in the Korean Intellectual Property Office on Aug. 27, 2015, the entire disclosure of which is incorporated herein by reference.

FIELD

This disclosure relates to a photosensitive resin composition and a color filter using the same.

BACKGROUND

Color filters are used for liquid crystal displays (LCDs), optical filters for cameras, and the like. Color filters may be manufactured by coating a fine region colored with three or more colors on a charge coupled device or a transparent substrate. This colored thin film can be manufactured using a pigment dispersion method, and the like.

A color photosensitive resin composition used for manufacturing a color filter by the pigment dispersion method generally includes a binder resin, a photopolymerizable monomer, a photopolymerization initiator, a pigment, a solvent, other additives, and the like.

The pigment used in the pigment dispersion method can have a limit in securing excellent luminescence. Accordingly, there have been efforts to improve luminescence characteristics by improving the binder resin. For example, Japanese Patent Laid-Open Pyeung 7-140654 and Pyeung 10-254133 use a carboxyl group-containing acrylic-based copolymer as the binder resin.

However, conventional pigments and even improved binder resins may not provide a color filter having the degree of luminance, heat resistance, and the like recently required due to high quality specifications. Accordingly, there is still a need for a photosensitive resin composition that can provide improved color characteristics such as luminance and heat resistance.

SUMMARY OF THE INVENTION

One embodiment provides a photosensitive resin composition that can have improved color characteristics and heat resistance.

Another embodiment provides a color filter manufactured using the photosensitive resin composition.

One embodiment provides a photosensitive resin composition including (A) a binder resin; (B) a photopolymerizable monomer; (C) a photopolymerization initiator; (D) a colorant; and (E) a solvent. The binder resin includes a first binder resin including structural units represented by Chemical Formulae 1 to 4, and the first binder resin is present in an amount of about 20 wt % to about 90 wt % based on the total amount (total weight, 100 wt %) of the binder resin.

[Chemical Formula 1]

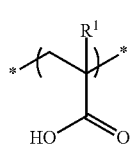

[Chemical Formula 2]

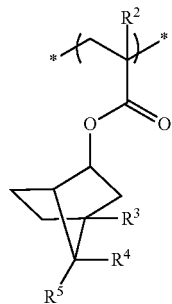

[Chemical Formula 3]

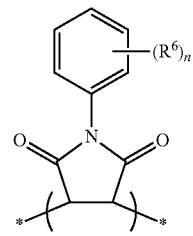

[Chemical Formula 4]

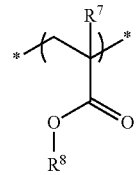

In Chemical Formulae 1 to 4, $R^1$, $R^2$, and $R^7$ are the same or different and are each independently a hydrogen atom or a substituted or unsubstituted C1 to C10 alkyl group, $R^3$ to $R^6$ are the same or different and are each independently a hydrogen atom, a substituted or unsubstituted C1 to C20 alkyl group, a substituted or unsubstituted C1 to C20 alkoxy group, a substituted or unsubstituted C6 to C20 aryl group, or a substituted or unsubstituted C6 to C20 aryloxy group, $R^8$ is a substituted or unsubstituted C12 to C20 alkyl group, and n is an integer ranging from 0 to 5.

The first binder resin may include about 10 to about 30 wt % of the structural unit represented by Chemical Formula 1; about 10 to about 30 wt % of the structural unit represented by Chemical Formula 2; about 5 to about 25 wt % of the structural unit represented by Chemical Formula 3; and about 35 to about 55 wt % of the structural unit represented by Chemical Formula 4, each based on the total amount (total weight, 100 wt %) of the first binder resin.

The first binder resin may have a weight average molecular weight of about 6,000 g/mol to about 10,000 g/mol.

The first binder resin may have an acid value of about 100 mgKOH/g to about 140 mgKOH/g.

The binder resin may further include a second binder resin, and the second binder resin may include the structural unit represented by Chemical Formula 1 and structural units represented by Chemical Formulae 5 to 8.

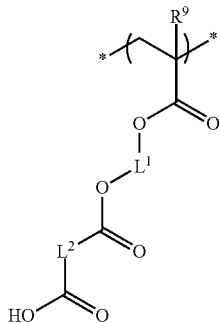
[Chemical Formula 5]

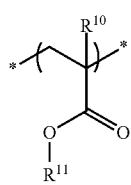
[Chemical Formula 6]

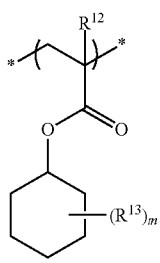
[Chemical Formula 7]

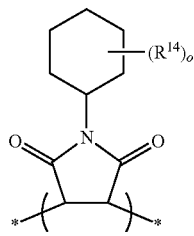
[Chemical Formula 8]

In Chemical Formulae 5 to 8, $R^9$, $R^{10}$, and $R^{12}$ are the same or different and are each independently a hydrogen atom or a substituted or unsubstituted C1 to C10 alkyl group, $R^{11}$ is a substituted or unsubstituted C1 to C10 alkyl group, $R^{13}$ and $R^{14}$ are the same or different and are each independently a hydrogen atom, a substituted or unsubstituted C1 to C20 alkyl group, a substituted or unsubstituted C1 to C20 alkoxy group, a substituted or unsubstituted C6 to C20 aryl group, or a substituted or unsubstituted C6 to C20 aryloxy group, $L^1$ and $L^2$ are the same or different and are each independently a substituted or unsubstituted C1 to C10 alkylene group, and m and o are the same or different and are each independently integers ranging from 0 to 5.

The second binder resin may be present in an amount of about 5 wt % to about 30 wt % based on the total amount (total weight, 100 wt %) of the binder resin.

The second binder resin may include about 10 to about 30 wt % of the structural unit represented by Chemical Formula 1; about 5 to about 15 wt % of the structural unit represented by Chemical Formula 5; about 10 to about 30 wt % of the structural unit represented by Chemical Formula 6; about 30 to about 50 wt % of the structural unit represented by Chemical Formula 7; and about 5 to about 15 wt % of the structural unit represented by Chemical Formula 8, each based on the total amount (total weight, 100 wt %) of the second binder resin.

The binder resin may include a third binder resin, and the third binder resin may include structural units represented by Chemical Formulae 9 to 11.

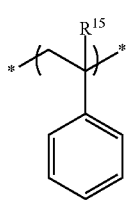
[Chemical Formula 9]

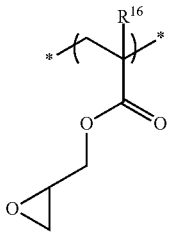
[Chemical Formula 10]

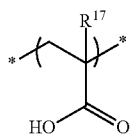
[Chemical Formula 11]

In Chemical Formulae 9 to 11, $R^{15}$ to $R^{17}$ are the same or different and are each independently a hydrogen atom or a substituted or unsubstituted C1 to C10 alkyl group.

The third binder resin may be present in an amount of about 10 wt % to about 50 wt % based on the total amount (total weight, 100 wt %) of the binder resin.

The binder resin may further include an epoxy-based binder resin.

The epoxy-based binder resin may be present in an amount of about 1 wt % to about 10 wt % based on the total amount (total weight, 100 wt %) of the binder resin.

The epoxy-based binder resin may have an epoxy equivalent weight ranging from about 150 g/eq to about 200 g/eq.

The colorant may include a dye, a pigment or a combination thereof, for example a pigment.

The pigment may include a green pigment, a yellow pigment, or a combination thereof.

The photosensitive resin composition may include (A) about 1 wt % to about 30 wt % of the binder resin; (B) about 1 wt % to about 20 wt % of the photopolymerizable monomer; (C) about 0.1 wt % to about 10 wt % of the photopolymerization initiator; (D) about 10 wt % to about 40 wt % of the colorant; and (E) a balance amount of the solvent, each based on the total amount (total weight, 100 wt %) of the photosensitive resin composition.

The photosensitive resin composition may further include at least one additive selected from malonic acid; 3-amino-1,2-propanediol; a silane-based coupling agent having a vinyl group or a (meth)acryloxy group; a leveling agent; a fluorine-based surfactant; and/or a radical polymerization initiator.

Another embodiment provides a color filter using the photosensitive resin composition.

Other embodiments of the present invention are included in the following detailed description.

The photosensitive resin composition can have excellent color characteristics, heat resistance, and the like and may provide a color filter capable of forming a pattern with reduced or no wrinkle formation on a surface of a substrate and having excellent luminance and an excellent contrast ratio, and an appropriate taper angle.

DETAILED DESCRIPTION

Figure 1:
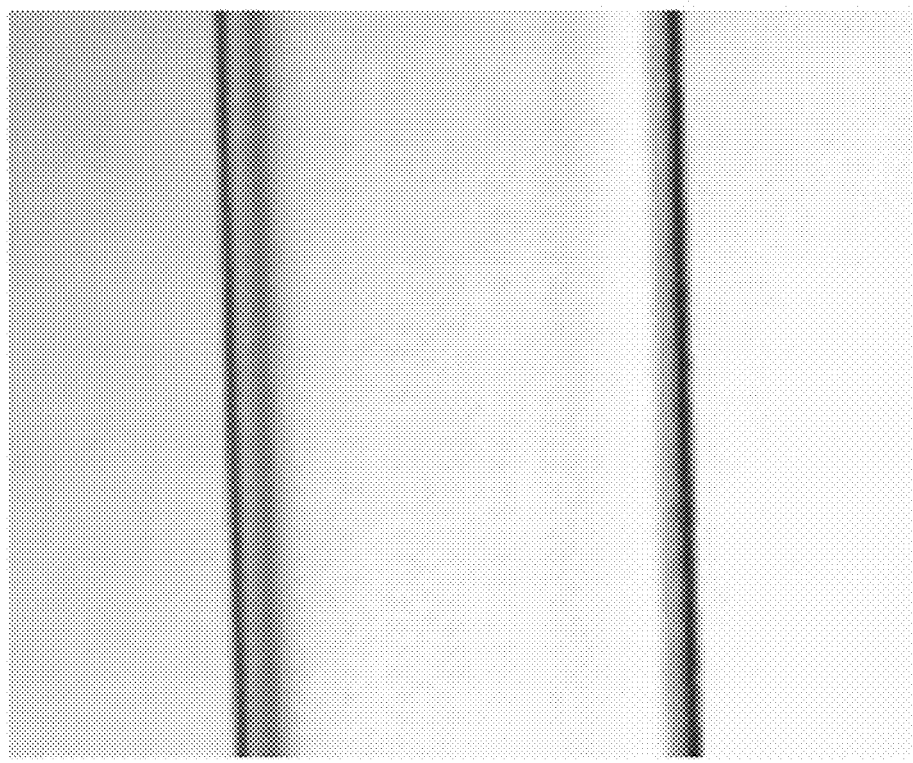
FIGS. 1 to 4 are each pattern photographs of specimens according to Examples 1 to 4.

The present invention will be described more fully hereinafter with reference to the accompanying drawings, in which exemplary embodiments of the present invention are shown. This invention may, however, be embodied in many different forms and should not be construed as limited to the exemplary embodiments set forth herein. These exemplary embodiments disclosed in this specification are provided so that this disclosure will satisfy applicable legal requirements.

As used herein, when a specific definition is not otherwise provided, the term "substituted" may refer to substitution with a halogen atom (F, Cl, Br, I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C30 heteroaryl group, or a combination thereof, instead of at least one hydrogen.

As used herein, when a specific definition is not otherwise provided, the term "hetero" may refer to one substituted with at least one hetero atom of N, O, S and/or P, instead of at least one carbon atom in a cyclic substituent.

As used herein, when a specific definition is not otherwise provided, "(meth)acrylate" refers to both "acrylate" and "methacrylate", and "(meth)acrylic acid" refers to "acrylic acid" and "methacrylic acid".

As used herein, when a specific definition is not otherwise provided, the term "combination" refers to mixing and/or copolymerization.

As used herein, unless a specific definition is otherwise provided, a hydrogen atom is bonded at the position when a chemical bond is not drawn where a bond would otherwise appear.

As used herein, when a specific definition is not otherwise provided, the term "epoxy equivalent weight" refers to gram of a resin including 1 equivalent epoxy group.

As used herein, when a specific definition is not otherwise provided, "*" indicates a point where the same or different atom or chemical formula is linked.

A photosensitive resin composition according to one embodiment includes (A) a binder resin; (B) a photopolymerizable monomer; (C) a photopolymerization initiator; (D) a colorant; and (E) a solvent.

The (A) binder resin includes a first binder resin including structural units represented by Chemical Formulae 1 to 4, and the first binder resin is present in an amount of about 20 wt % to about 90 wt % based on the total amount (total weight, 100 wt %) of the binder resin.

[Chemical Formula 1]

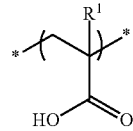

[Chemical Formula 2]

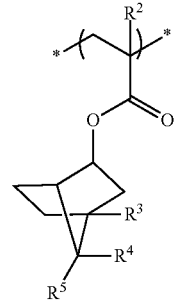

[Chemical Formula 3]

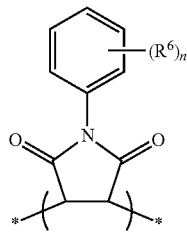

[Chemical Formula 4]

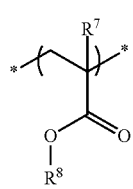

In Chemical Formulae 1 to 4, $R^1$, $R^2$, and $R^7$ are the same or different and are each independently a hydrogen atom or a substituted or unsubstituted C1 to C10 alkyl group, $R^3$ to $R^6$ are the same or different and are each independently a hydrogen atom, a substituted or unsubstituted C1 to C20 alkyl group, a substituted or unsubstituted C1 to C20 alkoxy group, a substituted or unsubstituted C6 to C20 aryl group, or a substituted or unsubstituted C6 to C20 aryloxy group, $R^8$ is a substituted or unsubstituted C12 to C20 alkyl group, and n is an integer ranging from 0 to 5.

According to one embodiment, the photosensitive resin composition includes a binder resin including the first binder resin. When the first binder resin is included in an amount of about 20 wt % to about 90 wt % based on the total amount (total weight, 100 wt %) of the binder resin, color reproducibility, exposure sensitivity, and pattern linearity may be secured, and simultaneously, thermal resistance properties and luminescence characteristics may be improved, while a conventional process of manufacturing a color filter pattern is still used.

Hereinafter, each component is described in detail.

(A) Binder Resin

A photosensitive resin composition according to one embodiment includes a binder resin, for example an acrylic-based binder resin. The acrylic-based binder resin is a first binder resin including structural units represented by Chemical Formulae 1 to 4.

The first binder resin may be present in an amount of about 20 wt % to about 90 wt %, for example about 25 wt % to about 85 wt %, based on the total amount (total weight, 100 wt %) of the binder resin. In some embodiments, the binder resin can include the first binder resin in an amount of about 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the first binder resin can be in a range from about any of the foregoing amounts to about any other of the foregoing amounts.

When the first binder resin is included in an amount of less than about 20 wt % based on the total amount of the binder resin, a wrinkle on the surface may be formed. When the first binder resin is included in an amount of greater than about 90 wt % based on the total amount of the binder resin, development rate can deteriorate.

The first binder resin may include about 10 to about 30 wt % of the structural unit represented by Chemical Formula 1; about 10 to about 30 wt % of the structural unit represented by Chemical Formula 2; about 5 to about 25 wt % of the structural unit represented by Chemical Formula 3; and about 35 to about 55 wt % of the structural unit represented by Chemical Formula 4, each based on the total amount (total weight, 100 wt %) of the first binder resin.

In some embodiments, the first binder resin can include the structural unit represented by Chemical Formula 1 in an amount of about 10, 11, 12, 13, 14, 15, 16, 17, 18, 19, 20, 21, 22, 23, 24, 25, 26, 27, 28, 29, or 30 wt %. Further, according to some embodiments of the present invention, the amount of the structural unit represented by Chemical Formula 1 can be in a range from about any of the foregoing amounts to about any other of the foregoing amounts. In some embodiments, the first binder resin can include the structural unit represented by Chemical Formula 2 in an amount of about 10, 11, 12, 13, 14, 15, 16, 17, 18, 19, 20, 21, 22, 23, 24, 25, 26, 27, 28, 29, or 30 wt %. Further, according to some embodiments of the present invention, the amount of the structural unit represented by Chemical Formula 2 can be in a range from about any of the foregoing amounts to about any other of the foregoing amounts.

In some embodiments, the first binder resin can include the structural unit represented by Chemical Formula 3 in an amount of about 5, 6, 7, 8, 9, 10, 11, 12, 13, 14, 15, 16, 17, 18, 19, 20, 21, 22, 23, 24, or 25 wt %. Further, according to some embodiments of the present invention, the amount of the structural unit represented by Chemical Formula 3 can be in a range from about any of the foregoing amounts to about any other of the foregoing amounts.

In some embodiments, the first binder resin can include the structural unit represented by Chemical Formula 4 in an amount of about 35, 36, 37, 38, 39, 40, 41, 42, 43, 44, 45, 46, 47, 48, 49, 50, 51, 52, 53, 54, or 55 wt %. Further, according to some embodiments of the present invention, the amount of the structural unit represented by Chemical Formula 4 can be in a range from about any of the foregoing amounts to about any other of the foregoing amounts.

When a structural unit represented by Chemical Formulae 1 to 4 respectively is included in the first binder resin in amounts within the above ranges, a photosensitive resin composition including this structural unit may provide a color filter that can have excellent heat resistance and luminance.

For example, the first binder resin may include about 15 to about 25 wt % of the structural unit represented by Chemical Formula 1; about 15 to about 25 wt % of the structural unit represented by Chemical Formula 2; about 10 to about 20 wt % of the structural unit represented by Chemical Formula 3; and about 40 to about 50 wt % of the structural unit represented by Chemical Formula 4, each based on the total amount (total weight, 100 wt %) of the first binder resin.

The first binder resin may have a weight average molecular weight of about 6,000 g/mol to about 10,000 g/mol, for example about 7,000 g/mol to about 9,000 g/mol. The first binder resin may have an acid value of about 100 mgKOH/g to about 140 mgKOH/g. When the first binder resin has a weight average molecular weight and an acid value within the above ranges, the photosensitive resin composition may have excellent physical and chemical properties, appropriate viscosity, and excellent close contacting (adhesive) property with a substrate during manufacture of a color filter.

The binder resin may further include a second binder resin including the structural unit represented by Chemical Formula 1 and structural units represented by Chemical Formulae 5 to 8.

[Chemical Formula 5]

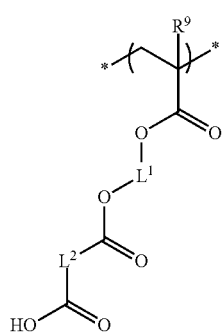

[Chemical Formula 6]

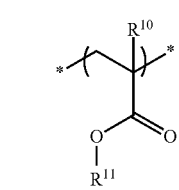

[Chemical Formula 7]

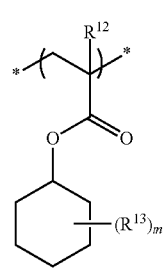

[Chemical Formula 8]

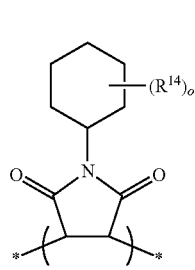

In Chemical Formulae 5 to 8, $R^9$, $R^{10}$, and $R^{12}$ are the same or different and are each independently a hydrogen atom or a substituted or unsubstituted C1 to C10 alkyl group, $R^{11}$ is a substituted or unsubstituted C1 to C10 alkyl group, $R^{13}$ and $R^{14}$ are the same or different and are each independently a hydrogen atom, a substituted or unsubstituted C1 to C20 alkyl group, a substituted or unsubstituted C1 to C20 alkoxy group, a substituted or unsubstituted C6 to C20 aryl group, or a substituted or unsubstituted C6 to C20 aryloxy group, $L^1$ and $L^2$ are the same or different and are each independently a substituted or unsubstituted C1 to C10 alkylene group, and m and o are the same or different and are each independently integers ranging from 0 to 5.

The second binder resin along with the first binder resin can be included in a binder resin according to one embodiment and may control formation of a wrinkle on a surface of a pattern during a process of manufacturing a color filter and thus can improve luminance.

For example, the second binder resin may be present in an amount of about 5 wt % to about 30 wt % based on the total amount (total weight, 100 wt %) of the binder resin. In some embodiments, the binder resin can include the second binder resin in an amount of about 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the second binder resin can be in a range from about any of the foregoing amounts to about any other of the foregoing amounts.

When the second binder resin is included in an amount of greater than about 30 wt % based on the total amount (total weight, 100 wt %) of the binder resin, an effect of improving (reducing) wrinkle formation on the surface of a pattern can deteriorate.

The second binder resin may include about 10 to about 30 wt % of the structural unit represented by Chemical Formula 1; about 5 to about 15 wt % of the structural unit represented by Chemical Formula 5; about 10 to about 30 wt % of the structural unit represented by Chemical Formula 6; about 30 to about 50 wt % of the structural unit represented by Chemical Formula 7; and about 5 to about 15 wt % of the structural unit represented by Chemical Formula 8, each based on the total amount (total weight, 100 wt %) of the second binder resin.

In some embodiments, the second binder resin can include the structural unit represented by Chemical Formula 1 in an amount of about 10, 11, 12, 13, 14, 15, 16, 17, 18, 19, 20, 21, 22, 23, 24, 25, 26, 27, 28, 29, or 30 wt %. Further, according to some embodiments of the present invention, the amount of the structural unit represented by Chemical Formula 1 can be in a range from about any of the foregoing amounts to about any other of the foregoing amounts.

In some embodiments, the second binder resin can include the structural unit represented by Chemical Formula 5 in an amount of about 5, 6, 7, 8, 9, 10, 11, 12, 13, 14, or 15 wt %. Further, according to some embodiments of the present invention, the amount of the structural unit represented by Chemical Formula 5 can be in a range from about any of the foregoing amounts to about any other of the foregoing amounts.

In some embodiments, the second binder resin can include the structural unit represented by Chemical Formula 6 in an amount of about 10, 11, 12, 13, 14, 15, 16, 17, 18, 19, 20, 21, 22, 23, 24, 25, 26, 27, 28, 29, or 30 wt %. Further, according to some embodiments of the present invention, the amount of the structural unit represented by Chemical Formula 6 can be in a range from about any of the foregoing amounts to about any other of the foregoing amounts.

In some embodiments, the second binder resin can include the structural unit represented by Chemical Formula 7 in an amount of about 30, 31, 32, 33, 34, 35, 36, 37, 38, 39, 40, 41, 42, 43, 44, 45, 46, 47, 48, 49, or 50 wt %. Further, according to some embodiments of the present invention, the amount of the structural unit represented by Chemical Formula 7 can be in a range from about any of the foregoing amounts to about any other of the foregoing amounts.

In some embodiments, the second binder resin can include the structural unit represented by Chemical Formula 8 in an amount of about 5, 6, 7, 8, 9, 10, 11, 12, 13, 14, or 15 wt %. Further, according to some embodiments of the present invention, the amount of the structural unit represented by Chemical Formula 8 can be in a range from about any of the foregoing amounts to about any other of the foregoing amounts.

When the structural units represented by Chemical Formula 1 and 5 to 8 are included in the second binder resin in an amount within the above ranges, a photosensitive resin composition including this structural unit may be used to provide a color filter having a pattern with reduced winkle formation on the surface.

For example, the second binder resin may include about 15 to about 25 wt % of the structural unit represented by Chemical Formula 1; about 5 to about 15 wt % of the structural unit represented by Chemical Formula 5; about 15 to about 25 wt % of the structural unit represented by Chemical Formula 6; about 35 to about 45 wt % of the structural unit represented by Chemical Formula 7; and about 5 to about 15 wt % of the structural unit represented by Chemical Formula 8, each based on the total amount (total weight, 100 wt %) of the second binder resin.

The second binder resin may have a weight average molecular weight of about 5,000 g/mol to about 20,000 g/mol, for example, about 8,000 g/mol to about 15,000 g/mol. The second binder resin may have an acid value of about 100 mgKOH/g to about 160 mgKOH/g. When the second binder resin has a weight average molecular weight and an acid value within the above ranges, formation of wrinkles on a surface may be easily controlled, and a taper can be well formed.

The binder resin may further include a third binder resin including structural units represented by Chemical Formulae 9 to 11.

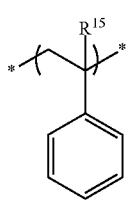

[Chemical Formula 9]

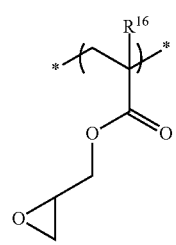

[Chemical Formula 10]

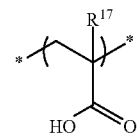

[Chemical Formula 11]

In Chemical Formulae 9 to 11, $R^{15}$ to $R^{17}$ are the same or different and are each independently a hydrogen atom or a substituted or unsubstituted C1 to C10 alkyl group.

The third binder resin can be included along with the first binder resin and/or the second binder resin in a binder resin according to one embodiment and may improve developability and residue characteristics as well as maintain an appropriate taper angle of a color filter pattern, for example, in a range of 40° to 70°.

For example, the third binder resin may be present in an amount of about 10 wt % to about 50 wt %, and as another example about 10 wt % to about 45 wt %, based on the total amount (total weight, 100 wt %) of the binder resin. In some embodiments, the binder resin can include the third binder resin in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the third binder resin can be in a range from about any of the foregoing amounts to about any other of the foregoing amounts.

When the third binder resin is included in an amount of less than about 10 wt % based on the total amount of the binder resin, developing time can increase. When the third binder resin is included in an amount of greater than about 50 wt % based on the total amount of the binder resin, developing time can be shortened, and close-contacting (adhesive) force and taper can deteriorate.

The third binder resin may have a weight average molecular weight of about 6,000 g/mol to about 15,000 g/mol, for example about 8,000 g/mol to about 12,000 g/mol. The third binder resin may have an acid value of about 80 mgKOH/g to about 140 mgKOH/g. When the third binder resin has a weight average molecular weight and an acid value within the above ranges, developability can be excellent, and taper can be well formed.

For example, the binder resin may include the first binder resin; the first binder resin and the second binder resin; the first binder resin and the third binder resin; or the first binder resin, the second binder resin and the third binder resin.

The binder resin may further include an epoxy-based binder resin, which can improve heat resistance of the binder resin.

Examples of the epoxy-based binder resin may include, for example, a phenol novolac epoxy resin, a tetramethyl biphenyl epoxy resin, a bisphenol A epoxy resin, a bisphenol F epoxy resin, an alicyclic epoxy resin, and the like, and combinations thereof, but is not limited thereto.

Furthermore, a binder resin including the epoxy-based binder resin can help secure dispersion stability of the colorant such as pigment and can help formation of pixels with a desire resolution during the development.

The epoxy-based binder resin may be present in an amount of about 1 wt % to about 10 wt %, for example about 5 wt % to about 10 wt %, based on the total amount (total weight, 100 wt %) of the binder resin. In some embodiments, the binder resin can include the epoxy-based binder resin in an amount of about 1, 2, 3, 4, 5, 6, 7, 8, 9, or 10 wt %. Further, according to some embodiments of the present invention, the amount of the epoxy-based binder resin can be in a range from about any of the foregoing amounts to about any other of the foregoing amounts.

When the epoxy-based binder resin is present in an amount within the above range, a film residue ratio and chemical resistance may be significantly improved.

The epoxy-based binder resin may have an epoxy equivalent weight ranging from about 150 g/eq to about 200 g/eq. When the epoxy-based binder resin having an epoxy equivalent weight within the range is included in the binder resin, the binder may improve a curing degree of a pattern and can promote adhesion of the colorant in a structure on which the pattern is formed.

The binder resin is a solid and is dissolved in a solvent to prepare a photosensitive resin composition. In this case, a binder resin solution in which the binder resin is dissolved can include the binder resin in a form of the solid in an amount of about 10 wt % to about 50 wt %, for example about 20 wt % to about 40 wt %, based on the total weight (100 wt %) of a binder resin solution in which the binder resin is dissolved.

The photosensitive resin composition can include the binder resin in a form of the solid in an amount of about 1 wt % to about 30 wt %, for example about 1 wt % to about 20 wt %, and as another example about 1 wt % to about 15 wt %, based on the total amount (total weight, 100 wt %) of the photosensitive resin composition. In some embodiments, the photosensitive resin composition can include the binder resin in a form of the solid in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the binder resin in a form of the solid can be in a range from about any of the foregoing amounts to about any other of the foregoing amounts.

When the binder resin in a form of the solid is present in an amount within the above range, developability and crosslinking can be improved, which can provide excellent surface smoothness during manufacture of a color filter.

(D) Colorant

The colorant may include a dye, a pigment, or a combination thereof, for example a pigment.

The pigment may include a red pigment, a yellow pigment, a blue pigment, a green pigment, or a combination thereof. For example, the pigment may include a green pigment, a yellow pigment or a combination thereof.

The red pigment may be a compound having at least one azo group. Examples of the red pigment can include without limitation C.I. (Color Index) pigment red 254, C.I. pigment red 242, C.I. pigment red 214, C.I. pigment red 221, C.I. pigment red 166, C.I. pigment red 220, C.I. pigment red 248, C.I. pigment red 262, and the like, and the red pigment may be used singularly or as a mixture of two or more.

Examples of the yellow pigment may include without limitation C.I. (Color Index) pigment yellow 139, C.I. pigment yellow 138, C.I. pigment yellow 150, and the like, and the yellow pigment may be used singularly or as a mixture of two or more. For example, the yellow pigment may include C.I. pigment yellow 138. The C.I. pigment yellow 138 can have good compatibility with the epoxy-based binder resin.

The blue pigment may be a copper phthalocyanine-based blue pigment. Examples of the blue pigment can include without limitation a C.I. blue pigment (Color Index Pigment Blue) 15, 15:3, 15:4, 15:6, 60, and the like and the blue pigment may be used singularly or as a mixture of two or more.

The green pigment may be a halogenated phthalocyanine-based green pigment. Examples of the green pigment can include without limitation, a C.I. green pigment (Color Index Pigment Green) 7, 36, 58, and the like and the green pigment may be used singularly or as a mixture of two or more.

The pigment may be itself added into the photosensitive resin composition according to one embodiment or added thereinto as a pigment dispersion including a dispersing agent, a solvent, or the like.

As used herein, the dispersing agent included in the pigment dispersion may be optionally a non-ionic dispersing agent, an ionic dispersing agent and/or a cationic dispersing agent. Examples of the dispersing agent can include without limitation polyalkylene glycols and esters thereof; polyoxyalkylenes; polyhydric alcohol ester alkyleneoxide addition products; alcohol alkyleneoxide addition products; alkylamines, and the like, and the dispersing agent can be used singularly or in a combination thereof. The dispersing agent may be included in an amount of about 10 parts by weight to about 20 parts by weight based on about 100 parts by weight of the pigment.

Examples of a solvent included in the pigment dispersion composition may include without limitation ethylene glycolacetate, ethylcellosolve, propylene glycol methyletheracetate, ethyllactate, polyethylene glycol, cyclohexanone, propylene glycolmethylether, and the like, and the solvent can be used singularly or in a combination thereof. As used herein, the amount of the solvent may be adjusted, so that a solid content of the pigment dispersion may be in a range of about 5 wt % to about 30 wt %, based on the total weight (100 wt %) of the pigment dispersion.

The pigment may have a particle diameter determined by considering factors such as dispersion stability, a pixel resolution, and the like, for example, an average particle diameter ranging from about 30 nm to about 200 nm.

The pigment dispersion may include the dispersing agent, the solvent and the solid pigment. The solid pigment may be present in an amount of about 8 wt % to about 20 wt % based on the total amount (total weight, 100 wt %) of the pigment dispersion. When the solid pigment is present in the pigment dispersion in an amount within the above range, color reproducibility, pattern forming capability, close contacting property, and curing characteristics can be improved.

The photosensitive resin composition can include the colorant in an amount of about 10 wt % to about 40 wt %, for example about 10 wt % to about 30 wt %, based on the total amount (total weight, 100 wt %) of the photosensitive resin composition. In some embodiments, the photosensitive resin composition can include the colorant in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the amount of the colorant can be in a range from about any of the foregoing amounts to about any other of the foregoing amounts.

When colorant is present in an amount within the above range, processibility and color characteristics may be improved.

(B) Photopolymerizable Monomer

The photopolymerizable monomer may be mono-functional and/or multi-functional ester of (meth)acrylic acid including at least one ethylenic unsaturated double bond.

The photopolymerizable monomer has the ethylenic unsaturated double bond and thus may cause sufficient polymerization during exposure in a pattern-forming process and can form a pattern having excellent heat resistance, light resistance, and chemical resistance.

Examples of the photopolymerizable monomer may include without limitation ethylene glycol di(meth)acrylate, diethylene glycol di(meth)acrylate, triethylene glycol di(meth)acrylate, propylene glycol di(meth)acrylate, neopentyl glycol di(meth)acrylate, 1,4-butanediol di(meth)acrylate, 1,6-hexanediol di(meth)acrylate, bisphenol A di(meth)acrylate, pentaerythritol di(meth)acrylate, pentaerythritol tri(meth)acrylate, pentaerythritol tetra(meth)acrylate, pentaerythritol hexa(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy(meth)acrylate, ethylene glycol monomethylether (meth)acrylate, trimethylol propane tri(meth)acrylate, tris(meth)acryloyloxyethyl phosphate, novolacepoxy (meth)acrylate, and the like, and combinations thereof.

Commercially available examples of the reactive unsaturated compound may include the following. The monofunctional (meth)acrylic acid ester may include without limitation Aronix M-101®, M-111®, and/or M-114® (Toagosei Chemistry Industry Co., Ltd.); KAYARAD TC-110S® and/or TC-120S® (Nippon Kayaku Co., Ltd.); V-158® and/or V-2311® (Osaka Organic Chemical Ind., Ltd.), and the like. Examples of a difunctional (meth)acrylic acid ester may include without limitation Aronix M-210®, M-240®, and/or M-6200® (Toagosei Chemistry Industry Co., Ltd.), KAYARAD HDDA®, HX-220®, and/or R-604® (Nippon Kayaku Co., Ltd.), V-260®, V-312®, and/or V-335 HP® (Osaka Organic Chemical Ind., Ltd.), and the like. Examples of a tri-functional (meth)acrylic acid ester may include without limitation Aronix M-309®, M-400®, M-405®, M-450®, M-7100®, M-8030®, and/or M-8060® (Toagosei Chemistry Industry Co., Ltd.), KAYARAD TMPTA®, DPCA-20®, DPCA-30®, DPCA-60®, and/or DPCA-120® (Nippon Kayaku Co., Ltd.), V-295®, V-300®, V-360®, V-GPT®, V-3PA®, and/or V-400® (Osaka Yuki Kayaku Kogyo Co. Ltd.), and the like. These may be used singularly or as a mixture of two or more.

The photopolymerizable monomer may be treated with acid anhydride to improve developability.

The photosensitive resin composition can include the photopolymerizable monomer in an amount of about 1 wt % to about 20 wt %, for example about 1 wt % to about 10 wt %, based on the total amount (total weight, 100 wt %) of the photosensitive resin composition. In some embodiments, the photosensitive resin composition can include the photopolymerizable monomer in an amount of about 1, 2, 3, 4, 5, 6, 7, 8, 9, 10, 11, 12, 13, 14, 15, 16, 17, 18, 19, or 20 wt %. Further, according to some embodiments of the present invention, the amount of the photopolymerizable monomer can be in a range from about any of the foregoing amounts to about any other of the foregoing amounts.

When the photopolymerizable monomer is included in an amount within the above range, the photopolymerizable monomer can be sufficiently cured during exposure in a pattern-forming process and can have excellent reliability, and developability for alkali developing solution may be improved.

(C) Photopolymerization Initiator

Examples of the photopolymerization initiator may include without limitation acetophenone-based compounds, benzophenone-based compounds, thioxanthone-based compounds, benzoin-based compounds, triazine-based compounds, oxime-based compounds, and the like, and combinations thereof.

Examples of the acetophenone-based compound may include without limitation 2,2'-diethoxy acetophenone, 2,2'-dibutoxy acetophenone, 2-hydroxy-2-methylpropinophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like, and combinations thereof.

Examples of the benzophenone-based compound may include without limitation benzophenone, benzoyl benzoate, benzoyl methyl benzoate, 4-phenyl benzophenone, hydroxy benzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like, and combinations thereof.

Examples of the thioxanthone-based compound may include without limitation thioxanthone, 2-chlorothioxanthone, 2-methylthioxanthone, isopropyl thioxanthone, 2,4-diethyl thioxanthone, 2,4-diisopropyl thioxanthone, and the like, and combinations thereof.

Examples of the benzoin-based compound may include without limitation benzoin, benzoin methyl ether, benzoin ethyl ether, benzoin isopropyl ether, benzoin isobutyl ether, benzyldimethylketal, and the like, and combinations thereof.

Examples of the triazine-based compound may include without limitation 2,4,6-trichloro-s-triazine, 2-phenyl 4,6-bis(trichloromethyl)-s-triazine, 2-(3', 4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl 4,6-bis(trichloro methyl)-s-triazine, bis(trichloromethyl)-6-styryl-s-triazine, 2-(naphtho1-yl)-4,6-bis(trichloromethyl)-s-triazine, 2-(4-methoxynaphtho1-yl)-4,6-bis(trichloromethyl)-s-triazine, 2,4-bis(trichloromethyl)-6-piperonyl-s-triazine, 2,4-bis(trichloromethyl)-6-(4-methoxystyryl)-s-triazine, and the like, and combinations thereof.

Examples of the oxime-based compound may include without limitation O-acyloxime-based compounds, 2-(o-benzoyloxime)-1-[4-(phenylthio)phenyl]-1,2-octandione, 1-(o-acetyloxime)-1-[9-ethyl-6-(2-methylbenzoyl)-9H-carbazol-3-yl]ethanone, and the like, and combinations thereof. Examples of the O-acyloxime-based compound may include without limitation 1,2-octandione, 2-dimethylamino-2-(4-methylbenzyl)-1-(4-morpholin-4-yl-phenyl)-butan-1-one, 1-(4-phenylsulfanyl phenyl)-butan-1,2-dione2-oxime-O-benzoate, 1-(4-phenylsulfanyl phenyl)-octane-1,2-dione2-oxime-O-benzoate, 1-(4-phenylsulfanyl phenyl)-octan-1-oneoxime-O-acetate, 1-(4-phenylsulfanyl phenyl)-butan-1-one oxime-O-acetate, and the like, and combinations thereof.

The photopolymerization initiator may further include one or more of a carbazole-based compound, a diketone-based compound, a sulfonium borate-based compound, a diazo-based compound, an imidazole-based compound, a biimidazole-based compound, and the like, instead of or in addition to one or more of the above compounds.

The photosensitive resin composition can include the photopolymerization initiator in an amount of about 0.1 wt % to about 10 wt %, for example about 0.1 wt % to about 5 wt %, based on the total amount (total weight, 100 wt %) of the photosensitive resin composition. In some embodiments, the photosensitive resin composition can include the photopolymerization initiator in an amount of about 0.1, 0.2, 0.3, 0.4, 0.5, 0.6, 0.7, 0.8, 0.9, 1, 2, 3, 4, 5, 6, 7, 8, 9, or 10 wt %. Further, according to some embodiments of the present invention, the amount of the photopolymerization initiator can be in a range from about any of the foregoing amounts to about any other of the foregoing amounts.

When the photopolymerization initiator is included in an amount within the above range, sufficient photopolymerization can occur during exposure in a pattern-forming process, and deterioration of transmittance due to the presence of a non-reacted initiator may be reduced or prevented.

(E) Solvent

The solvent is a material having compatibility with the colorant, the acrylic-based binder resin, the photopolymerizable monomer, the photopolymerization initiator, and the colorant but not reacting therewith.

The solvent is not particularly limited. Examples of the solvent can include without limitation alcohols such as methanol, ethanol and the like; ethers such as dichloroethyl ether, n-butyl ether, diisoamyl ether, methylphenyl ether, tetrahydrofuran, and the like; glycol ethers such ethylene glycol methylether, ethylene glycol ethylether, propylene glycol methylether and the like; cellosolve acetates such as methyl cellosolve acetate, ethyl cellosolve acetate, diethyl cellosolve acetate, and the like; carbitols such methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; alkyl lactate esters such as methyl lactate, ethyl lactate, and the like; hydroxyacetic acid alkyl esters such as methyl hydroxyacetate, ethyl hydroxyacetate, butyl hydroxyacetate, and the like; alkoxyalkyl acetate esters such as methoxymethyl acetate, methoxyethyl acetate, methoxybutyl acetate, ethoxymethyl acetate, ethoxyethyl acetate, and the like; 3-hydroxypropionic acid alkyl esters such as methyl 3-hydroxypropionate, ethyl 3-hydroxypropionate, and the like; 3-alkoxypropionic acid alkyl esters such as methyl 3-methoxypropionate, ethyl 3-methoxypropionate, ethyl 3-ethoxypropionate, methyl 3-ethoxypropionate, and the like; 2-hydroxypropionic acid alkyl esters such as methyl 2-hydroxypropionate, ethyl 2-hydroxypropionate, propyl 2-hydroxypropionate, and the like; 2-alkoxypropionic acid alkyl esters such as methyl 2-methoxypropionate, ethyl 2-methoxypropionate, ethyl 2-ethoxypropionate, methyl 2-ethoxypropionate, and the like; 2-hydroxy-2-methylpropionic acid alkyl esters such as methyl 2-hydroxy-2-methylpropionate, ethyl 2-hydroxy-2-methylpropionate, and the like; 2-alkoxy-2-methylpropionic acid alkyl esters such as methyl 2-methoxy-2-methylpropionate, ethyl 2-ethoxy-2-methylpropionate, and the like; esters such as 2-hydroxyethyl propionate, 2-hydroxy-2-methylethyl propionate, hydroxyethyl acetate, methyl 2-hydroxy-3-methylbutanoate, and the like; ketonate esters such as ethyl pyruvate, and the like. Additionally, a solvent such as N-methylformamide, N,N-dimethylformamide, N-methylformanilide, N-methylacetamide, N,N-dimethylacetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like may be also used. The solvents may be used singularly or as a mixture of two or more.

Considering miscibility and reactivity, glycol ethers such as ethylene glycol monoethyl ether, and the like; ethylene glycol alkylether acetates such as ethyl cellosolve acetate, and the like; esters such as 2-hydroxyethyl propionate, and the like; diethylene glycols such as diethylene glycol monomethyl ether, and the like; propylene glycol alkylether acetates such as propylene glycol monomethylether acetate, propylene glycol propylether acetate and the like may be used.

The photosensitive resin composition can include the solvent in a balance amount, for example about 20 wt % to 80 wt % based on the total amount (total weight, 100 wt %) of the photosensitive resin composition. In some embodiments, the photosensitive resin composition can include the solvent in an amount of about 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, or 80 wt %. Further, according to some embodiments of the present invention, the amount of the solvent can be in a range from about any of the foregoing amounts to about any other of the foregoing amounts.

When the solvent is included in an amount within the above range, the photosensitive resin composition can have improved processibility due to an appropriate viscosity during manufacture of a color filter.

(F) Other Additives

The photosensitive resin composition may further include one or more other additives. Examples of the additives can include without limitation malonic acid; 3-amino-1,2-propanediol; a coupling agent including a vinyl group or a (meth)acryloxy group; a leveling agent; a surfactant; and/or a radical polymerization initiator, for example to prevent stains or spots during the coating, to adjust leveling, and/or to prevent pattern residue due to non-development.

The amount of the additive may be controlled and can be readily determined by the skilled artisan depending on desired properties of the composition and resultant film.

The coupling agent may be a silane-based coupling agent. Examples of the silane-based coupling agent may include without limitation trimethoxysilyl benzoic acid, γ-methacryl oxypropyl trimethoxysilane, vinyl triacetoxysilane, vinyl trimethoxysilane, γ-isocyanate propyl triethoxysilane, γ-glycidoxy propyl trimethoxysilane, β-(3,4-epoxycyclohexyl) ethyltrimethoxysilane, and the like. These may be used singularly or in a mixture of two or more.

The photosensitive resin composition can include the silane-based coupling agent in an amount of about 0.01 part by weight to about 1 part by weight based on about 100 parts by weight of the photosensitive resin composition.

The photosensitive resin composition for a color filter may further include a surfactant, for example a fluorine-based surfactant as needed.

Examples of the fluorine-based surfactant may include F-482, F-484, F-478, and the like available from DIC Co., Ltd., but are not limited thereto.

The photosensitive resin composition can include the surfactant in an amount of about 0.01 wt % to about 5 wt %, for example about 0.01 wt % to about 2 wt %, based on the total amount (total weight, 100 wt %) of the photosensitive resin composition. When the surfactant is used in an amount outside of the above range, impurities can be generated after development.

The photosensitive resin composition according to one embodiment may be an alkali development type capable of being cured by radiating light and being developed with an alkali aqueous solution. When the photosensitive resin composition is applied to (laminated on) a substrate and radiated by an actinic ray to form a pattern for a color filter, the photosensitive resin composition is reacted by the actinic ray and thus solubility a reaction (exposed) region sharply deteriorates compared with a non-reaction (non-exposed) region. Accordingly, the non-reaction region may be selectively dissolved. The solution removing a non-exposure region is called a developing solution, and this developing solution can be classified into two types, an organic solvent type and an alkali development type. The organic solvent type developing solution can cause atmosphere contamination and can harm a human body, and thus the alkali development type solution may be used.

Another embodiment provides a color filter manufactured using the above photosensitive resin composition.

Patterns of the color filter may have a taper angle of about 40° to about 70°.

A method of manufacturing the color filter can be as follows.

The above photosensitive resin composition can be coated to form an about 0.5 µm to about 10 µm-thick photosensitive resin composition layer on a glass substrate in an appropriate method such as spin coating, roller coating, spray coating, and the like.

Subsequently, the substrate having the photosensitive resin composition layer can be radiated by light to form a pattern required for a color filter. The radiation may be performed by using UV, an electron beam, or an X-ray as a light source, for example, UV in a range of about 190 nm to about 450 nm and as another example about 200 nm to about 400 nm. The radiation may be performed by further using a photoresist mask. After performing the radiation process in this way, the photosensitive resin composition layer exposed to the light source can be treated with a developing solution. Herein, a non-exposure region in the photosensitive resin composition layer can be dissolved and can form the pattern required for a color filter. This process can be repeated according to the number of necessary colors, obtaining a color filter having a desired pattern. In addition, crack resistance, solvent resistance, and the like may be improved by reheating the image pattern obtained through the development, radiating an actinic ray thereinto, or the like to cure it.

Hereinafter, the present invention is illustrated in more detail with reference to the following examples. These examples, however, are not in any sense to be interpreted as limiting the scope of the invention.

Preparation of Photosensitive Resin Composition

Examples 1 to 4 and Comparative Examples 1 to 6

The following photopolymerization initiator is dissolved in the following solvent according to a composition provided in Table 1, and the solution is stirred at room temperature for 2 hours. Subsequently, an acrylic-based binder resin and a photopolymerizable monomer are added thereto, and the mixture is stirred at room temperature for 2 hours. Then, a colorant is added thereto, the mixture is stirred at room temperature for one hour, a surfactant is added thereto, and the resulting mixture is stirred at room temperature for one hour. The solution is three times filtered to remove impurities therein, preparing each photosensitive resin composition according to Examples 1 to 6 and Comparative Examples 1 to 6. The photosensitive resin composition is prepared by using the following components.

(A) Binder Resin
(A-1) First Binder Resin

A first binder resin includes a structural unit represented by Chemical Formula 1-1, a structural unit represented by Chemical Formula 2-1, a structural unit represented by Chemical Formula 3-1, and a structural unit represented by Chemical Formula 4-1 in a weight ratio of 20:20:15:45, and has a weight average molecular weight of 8,500 g/mol, and an acid value of 110 mgKOH/g.

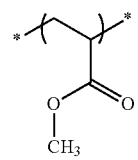

[Chemical Formula 1-1]

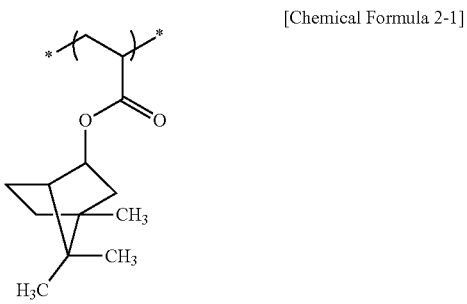

[Chemical Formula 2-1]

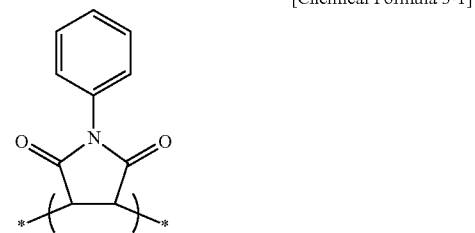

[Chemical Formula 3-1]

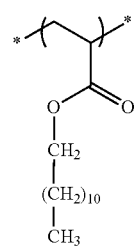

[Chemical Formula 4-1]

(A-2) Second Binder Resin

A second binder resin includes the structural unit represented by Chemical Formula 1-1, a structural unit represented by Chemical Formula 5-1, a structural unit represented by Chemical Formula 6-1, a structural unit represented by Chemical Formula 7-1, and a structural unit represented by Chemical Formula 8-1 in a weight ratio of 20:10:20:40:10, and has a weight average molecular weight of 11,000 g/mol, and an acid value of 120 mgKOH/g.

[Chemical Formula 5-1]

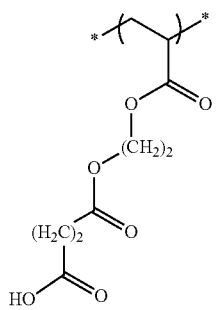

[Chemical Formula 6-1]

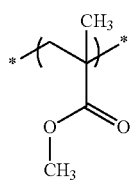

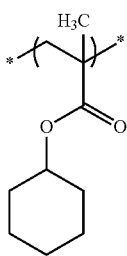

[Chemical Formula 8-1]

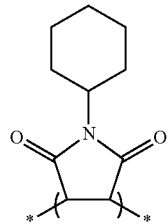

(A-3) Third Binder Resin: A binder resin commercially available under the trade name RY-15 from Showa-denko Co., is used.

(A-4) Acrylic-based Binder Resin: An acrylic-based binder resin commercially available under the trade name SKY-095 from Samsung SDI, is used.

(A-5) Acrylic-based Binder Resin: An acrylic-based binder resin commercially available under the trade name SKY-141 from Samsung SDI, is used.

(A-6) Epoxy-based binder resin: An epoxy-based binder resin commercially available under the trade nameEHPE-3150 from Daicel Chemical Co., is used (an epoxy equivalent weight: 177 g/eq)

(B) Photopolymerizable Monomer (B-1) Photopolymerizable monomer: Dipentaerythritol-hexaacrylate (DPHA) is used.

(B-2) Photopolymerizable monomer developability improvement-type: A photopolymerizable monomer commercially available as A-BPE-20 from Shin-Nakamura Chemical Co., Ltd., is used.

(C) Photopolymerization Initiator (C-1) An oxime-based compound commercially available as IRGARCURE OXE01 from BASF is used.

(D) Colorant (D-1) A pigment dispersion including G58, commercially available as SGTC 49G from SKC Inc. (a pigment solid: 12%), is used.

(D-2) A pigment dispersion including Y138, commercially available as SF Yellow GC6018 from SANYO COLOR WORKS, Ltd. (a pigment solid: 12%), is used.

(E) Solvent (E-1) Propylene glycolmonomethyl ether acetate (PG-MEA) is used.

(F) Additive (F-1) A surfactant commercially available as F-554 from DIC Co., Ltd., is used.

TABLE 1

(unit: wt %)

| | | Ex. 1 | Ex. 2 | Ex. 3 | Ex. 4 | Comp. Ex. 1 | Comp. Ex. 2 | Comp. Ex. 3 | Comp. Ex. 4 | Comp. Ex. 5 | Comp. Ex. 6 |
|---|---|---|---|---|---|---|---|---|---|---|---|
| (A) Binder resin** | A-1 | 9.10 | 7.07 | 5.37 | 3.07 | — | — | — | — | 2.07 | 10.27 |
| | A-2 | — | 1.00 | 2.00 | 3.00 | 10.57 | — | — | 3.00 | 3.00 | 0.15 |
| | A-3 | 1.47 | 2.50 | 3.20 | 4.50 | — | — | — | 7.57 | 5.50 | 0.15 |
| | A-4 | — | — | — | — | — | 10.57 | — | — | — | — |
| | A-5 | — | — | — | — | — | — | 10.57 | — | — | — |
| | A-6 | 0.65 | 0.65 | 0.65 | 0.65 | 0.65 | 0.65 | 0.65 | 0.65 | 0.65 | 0.65 |
| (B) Photopolymerizable monomer | B-1 | 7.26 | 7.26 | 7.26 | 7.26 | 7.26 | 7.26 | 7.26 | 7.26 | 7.26 | 7.26 |
| | B-2 | 0.81 | 0.81 | 0.81 | 0.81 | 0.81 | 0.81 | 0.81 | 0.81 | 0.81 | 0.81 |
| (C) Photopolymerization initiator | C-1 | 0.75 | 0.75 | 0.75 | 0.75 | 0.75 | 0.75 | 0.75 | 0.75 | 0.75 | 0.75 |

TABLE 1-continued (unit: wt %)

|   |   | Ex. 1 | Ex. 2 | Ex. 3 | Ex. 4 | Comp. Ex. 1 | Comp. Ex. 2 | Comp. Ex. 3 | Comp. Ex. 4 | Comp. Ex. 5 | Comp. Ex. 6 |
|---|---|---|---|---|---|---|---|---|---|---|---|
| (D) Colorant | D-1 | 12.20 | 12.20 | 12.20 | 12.20 | 12.20 | 12.20 | 12.20 | 12.20 | 12.20 | 12.20 |
|  | D-2 | 10.86 | 10.86 | 10.86 | 10.86 | 10.86 | 10.86 | 10.86 | 10.86 | 10.86 | 10.86 |
| (E) Solvent | E-1 | 56.87 | 56.87 | 56.87 | 56.87 | 56.87 | 56.87 | 56.87 | 56.87 | 56.87 | 56.87 |
| (F) Additive | F-1 | 0.03 | 0.03 | 0.03 | 0.03 | 0.03 | 0.03 | 0.03 | 0.03 | 0.03 | 0.03 |
| Total |  | 100.00 | 100.00 | 100.00 | 100.00 | 100.00 | 100.00 | 100.00 | 100.00 | 100.00 | 100.00 |

(**an amount of the binder resin is based on 30% of a solid)

Evaluation 1: Color Characteristics of Photosensitive Resin Composition

Each photosensitive resin composition according to Examples 1 to 4 and Comparative Examples 1 to 6 is respectively coated on a glass substrate with a coating equipment (MIKASA Co., Ltd.) and dried on a hot plate at 90° C., obtaining each film. The films are exposed to light with 50 mJ/cm² of an exposure dose and baked at an oven condition of 230° C. for 28 minutes. The films are additionally baked at 230° C. for 1 hour, a color coordinate and luminance of the films are measured by using a spectrophotometer (Otsuka Electronics Co., Ltd., MCPD 3000) before and after post-baking (PSB), and the results are provided in Table 2. Color coordinate (Gx) and luminance (Y) are calculated based on the color coordinate (Gy).

TABLE 2

|  | Step | Color coordinate (Gx) | Color coordinate (Gy) | Luminance (Y) | Contrast ratio |
|---|---|---|---|---|---|
| Example 1 | Before additional baking | 0.2792 | 0.578 | 63.05 |  |
|  | After additional baking | 0.2772 | 0.578 | 62.37 | 13466 |
| Example 2 | Before additional baking | 0.2782 | 0.578 | 62.78 |  |
|  | After additional baking | 0.2768 | 0.578 | 62.37 | 13264 |
| Example 3 | Before additional baking | 0.2765 | 0.578 | 62.47 |  |
|  | After additional baking | 0.2759 | 0.578 | 62.28 | 13259 |
| Example 4 | Before additional baking | 0.2768 | 0.578 | 62.61 |  |
|  | After additional baking | 0.2762 | 0.578 | 62.52 | 13369 |
| Comparative Example 1 | Before additional baking | 0.2774 | 0.578 | 62.76 |  |
|  | After additional baking | 0.2762 | 0.578 | 62.02 | 13443 |
| Comparative Example 2 | Before additional baking | 0.2768 | 0.578 | 62.50 |  |
|  | After additional baking | 0.2761 | 0.578 | 61.54 | 13179 |
| Comparative Example 3 | Before additional baking | 0.2767 | 0.578 | 62.58 |  |
|  | After additional baking | 0.2763 | 0.578 | 61.23 | 12996 |
| Comparative Example 4 | Before additional baking | 0.2763 | 0.578 | 62.01 |  |
|  | After additional baking | 0.2759 | 0.578 | 61.38 | 13111 |
| Comparative Example 5 | Before additional baking | 0.2766 | 0.578 | 62.05 |  |
|  | After additional baking | 0.2761 | 0.578 | 61.44 | 12981 |
| Comparative Example 6 | Before additional baking | 0.2759 | 0.578 | 61.88 |  |
|  | After additional baking | 0.2757 | 0.578 | 61.24 | 13044 |

Referring to Table 2, the photosensitive resin compositions according to Examples 1 to 4 show excellent luminance and an excellent contrast ratio compared with the photosensitive resin compositions according to Comparative Examples 1 to 6.

Evaluation 2: Taper Angle and Wrinkle of Pattern

Figure 2:
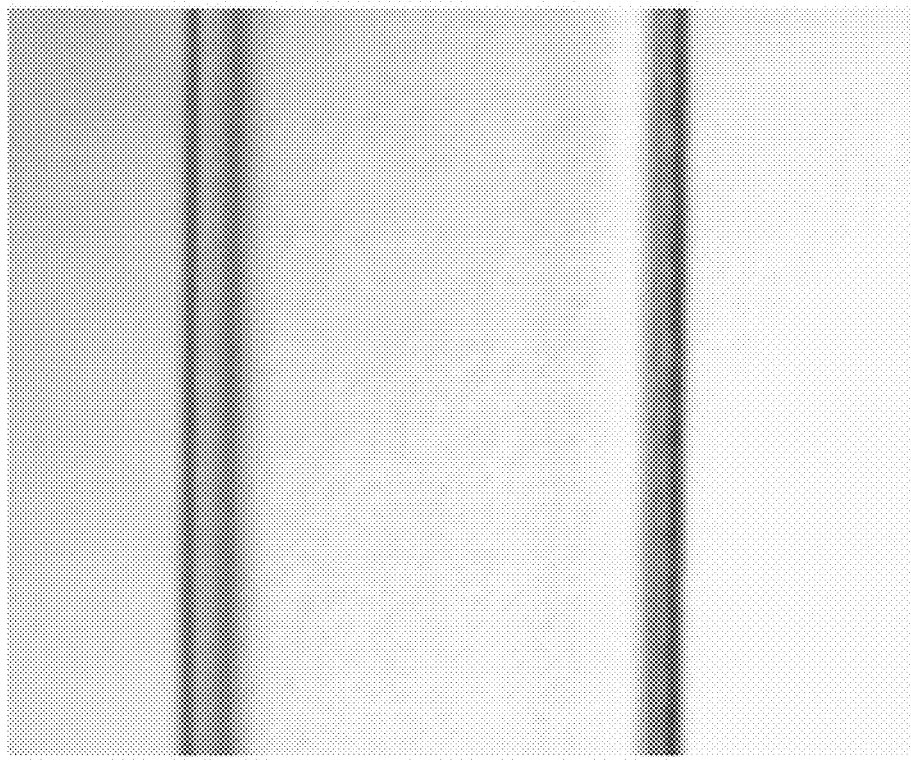
Figure 3:
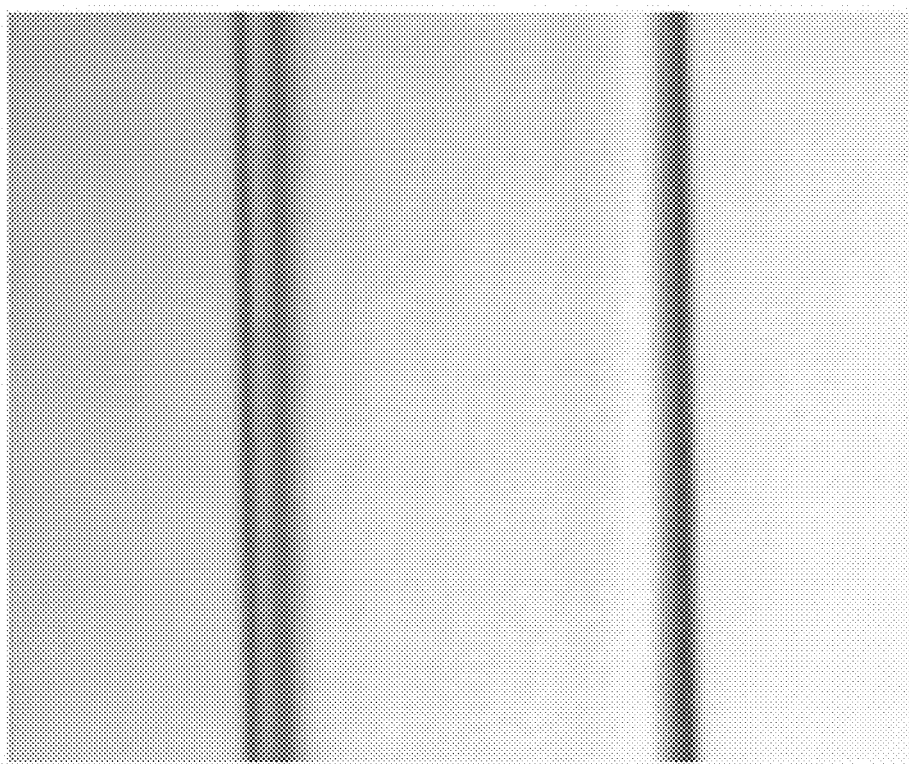
Figure 4:
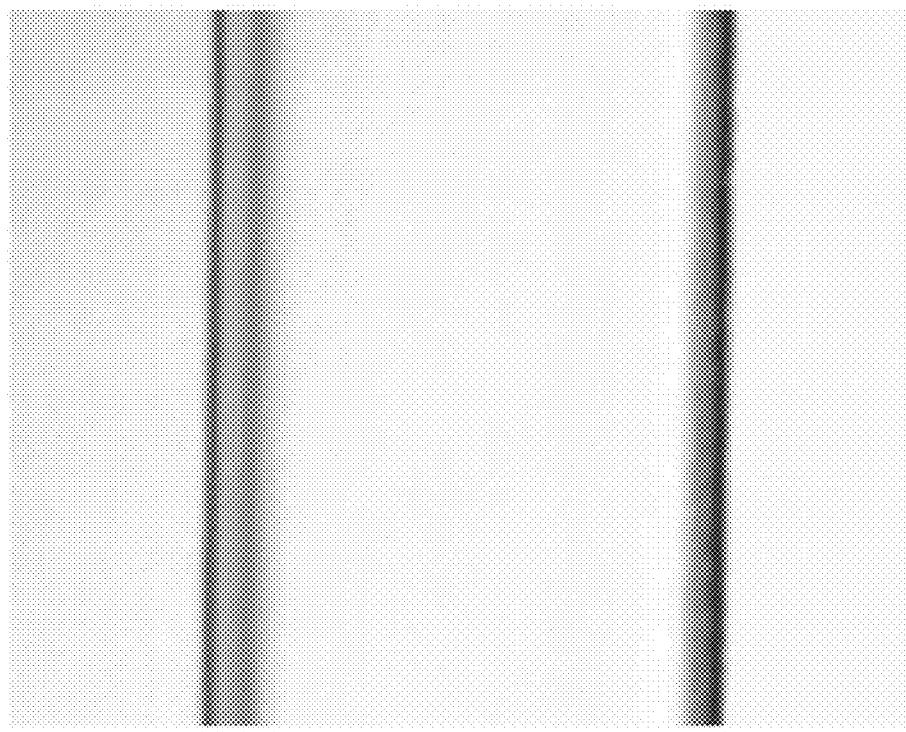
Figure 5:
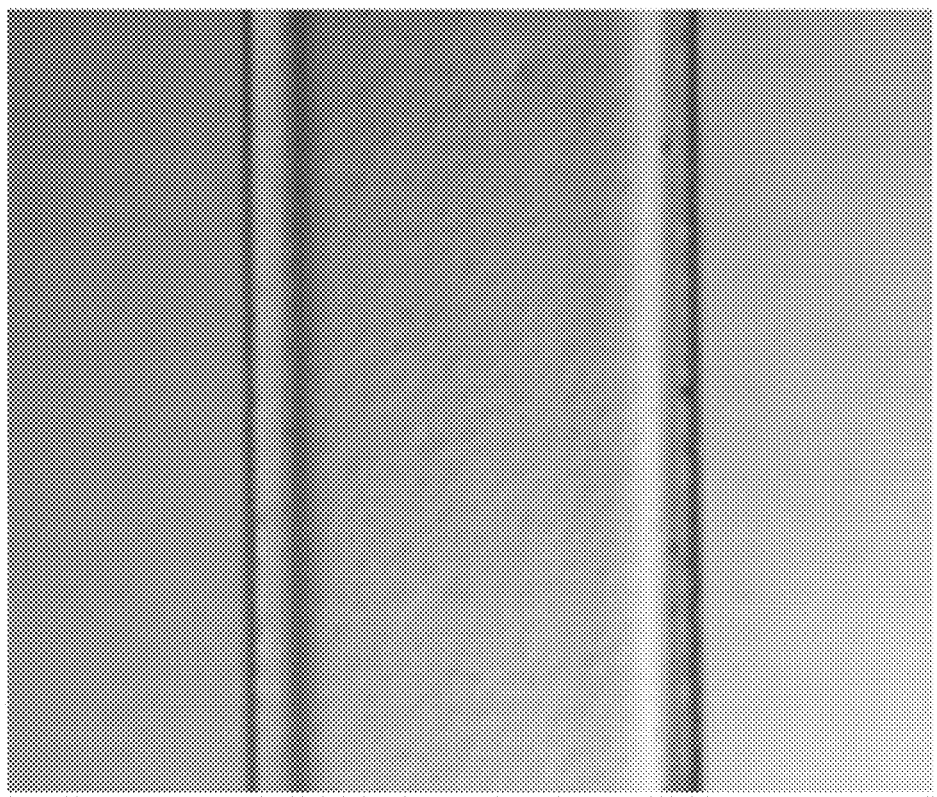
FIGS. 5 to 10 are each pattern photographs of specimens according to Comparative Examples 1 to 6.
Figure 6:
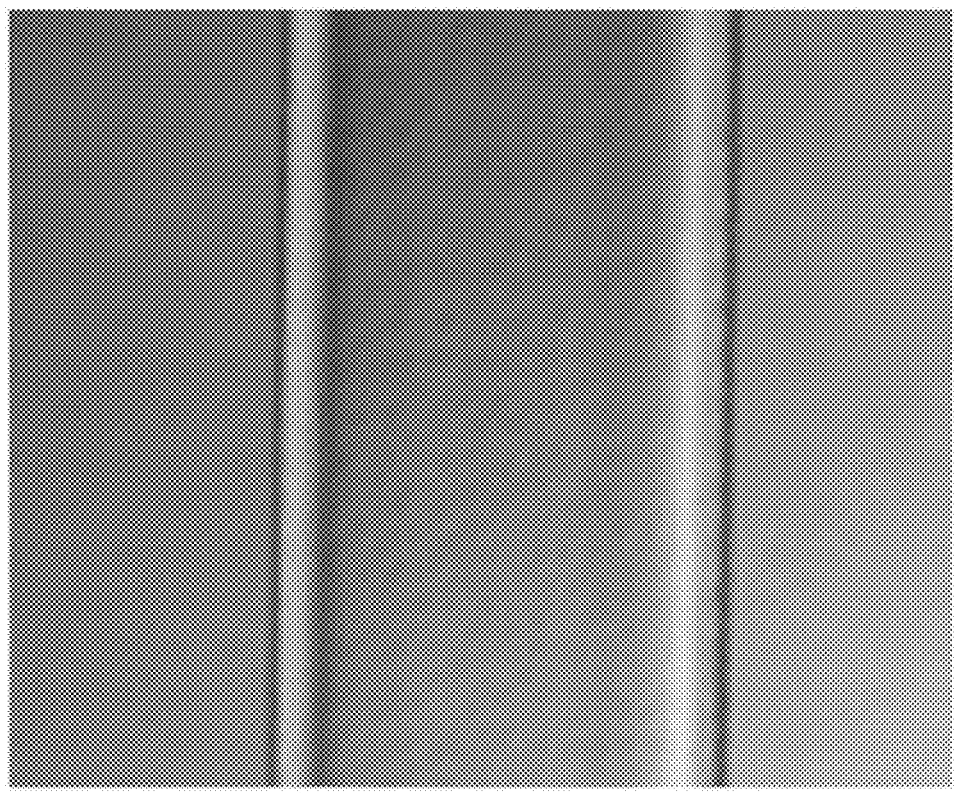
Figure 7:
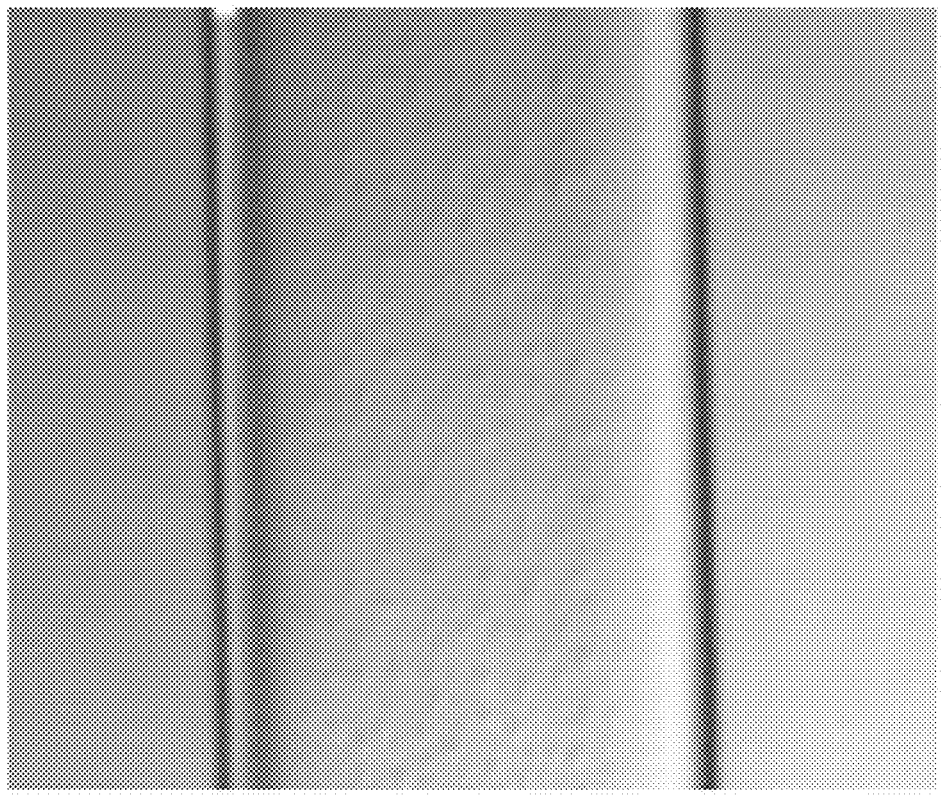
Figure 8:
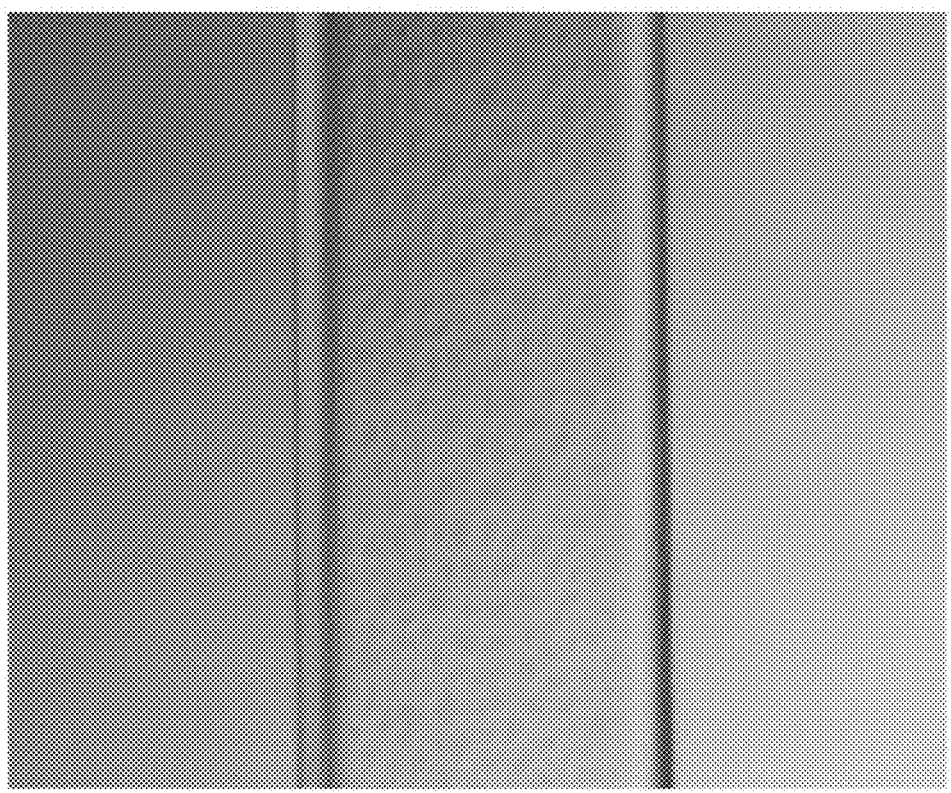
Figure 9:
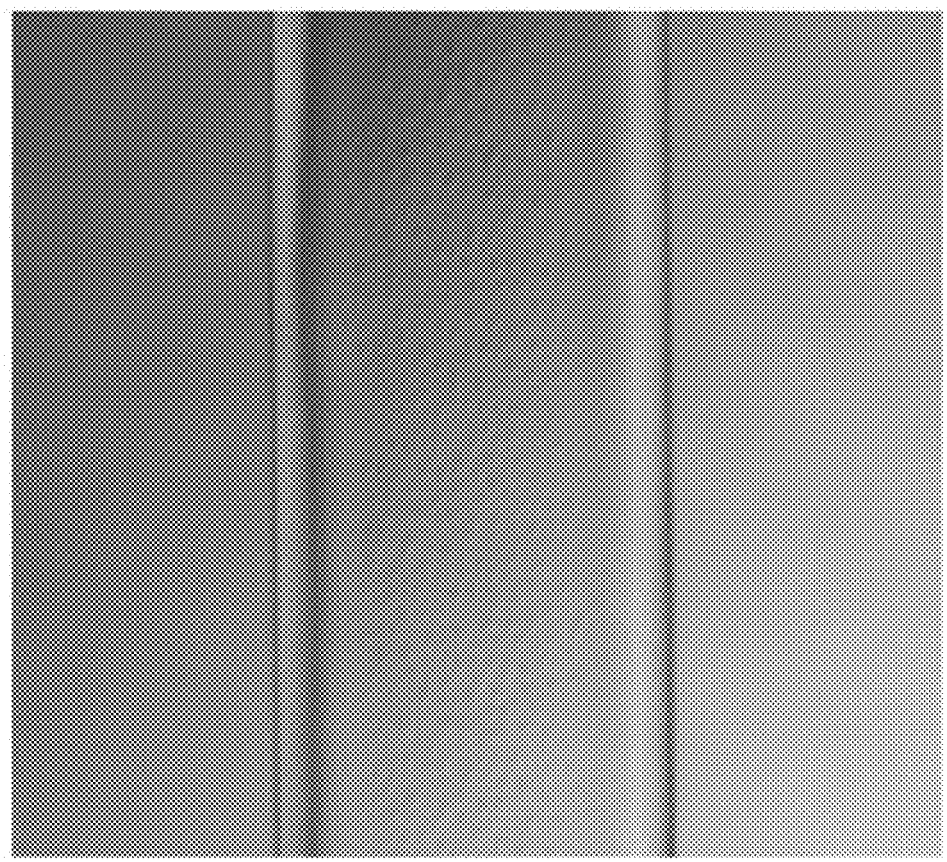
Figure 10:
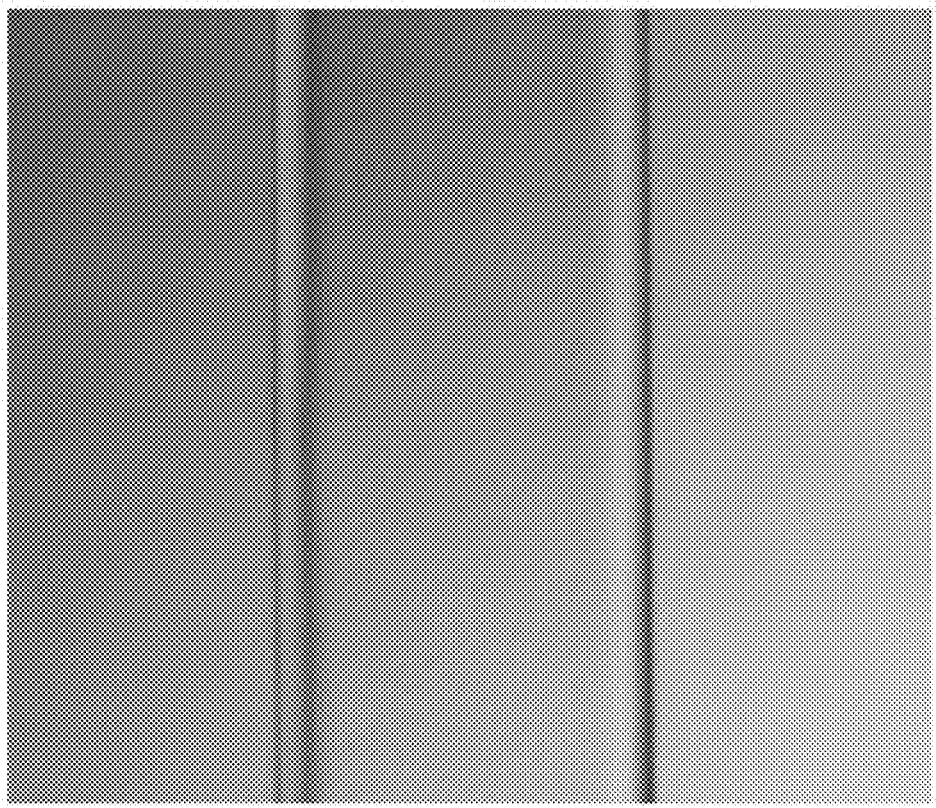
Figure 11:
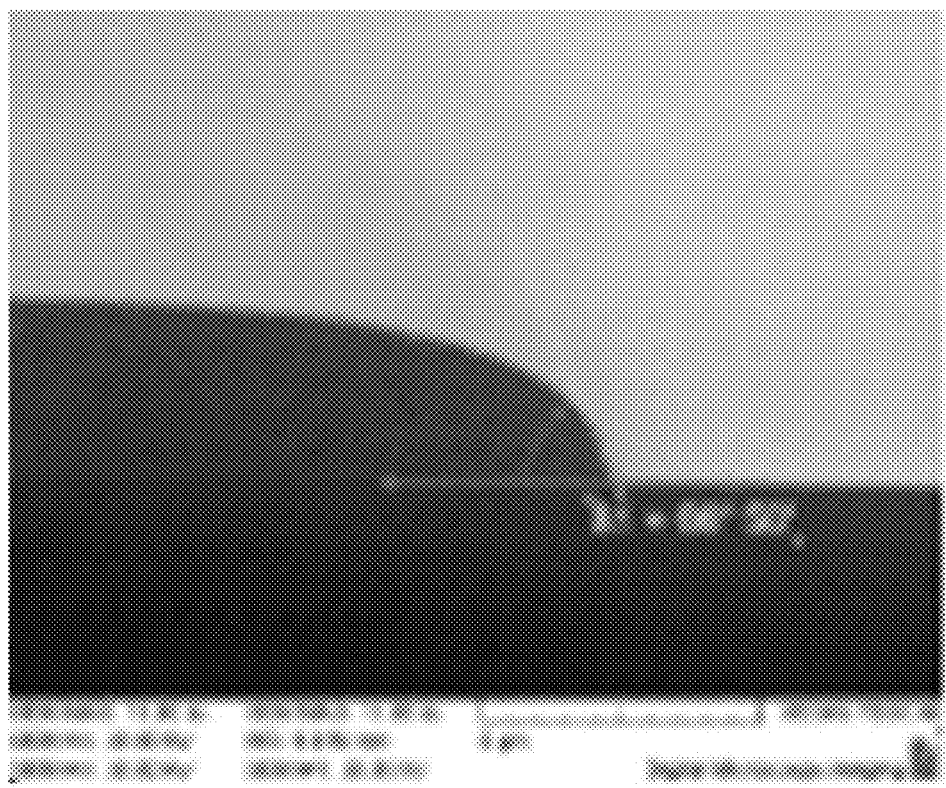
FIGS. 11 to 14 are each pattern photographs of the specimens according to Examples 1 to 4.
Figure 12:
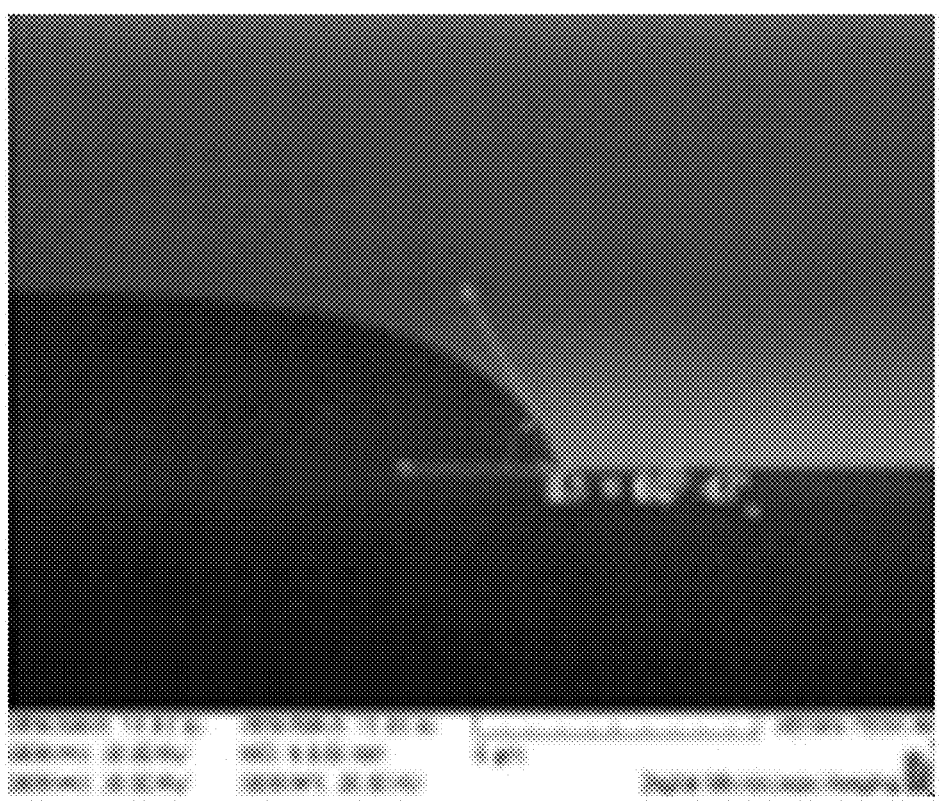
Figure 13:
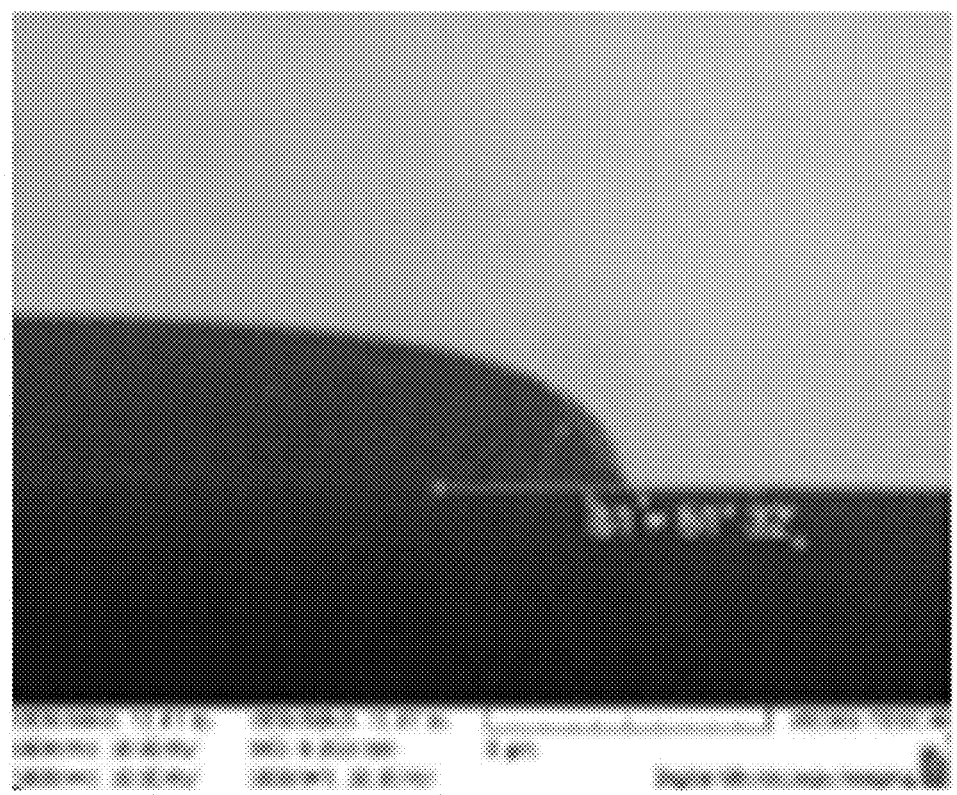
Figure 14:
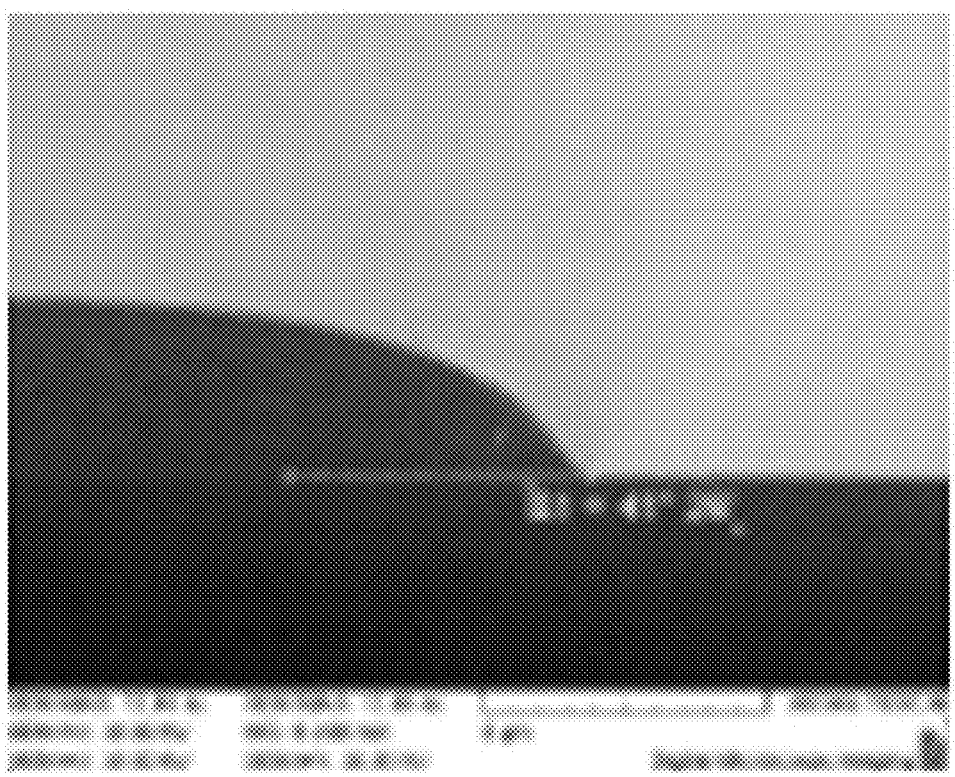
Figure 15:
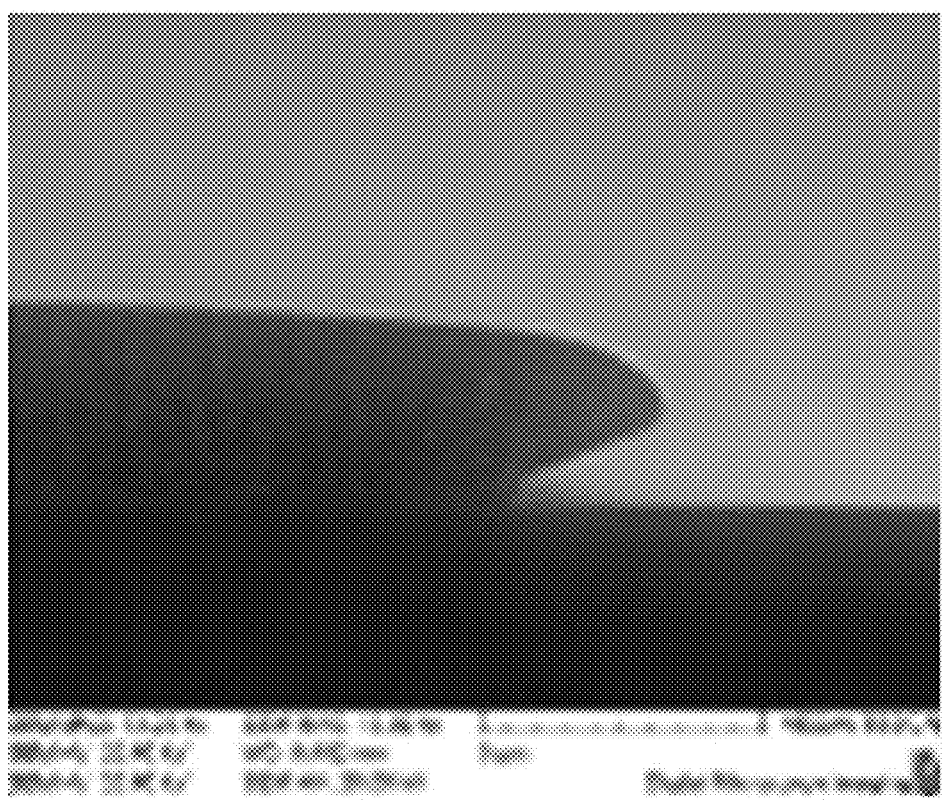
FIGS. 15 to 20 are each pattern photographs of the specimens according to Comparative Examples 1 to 6.
Figure 16:
Figure 17:
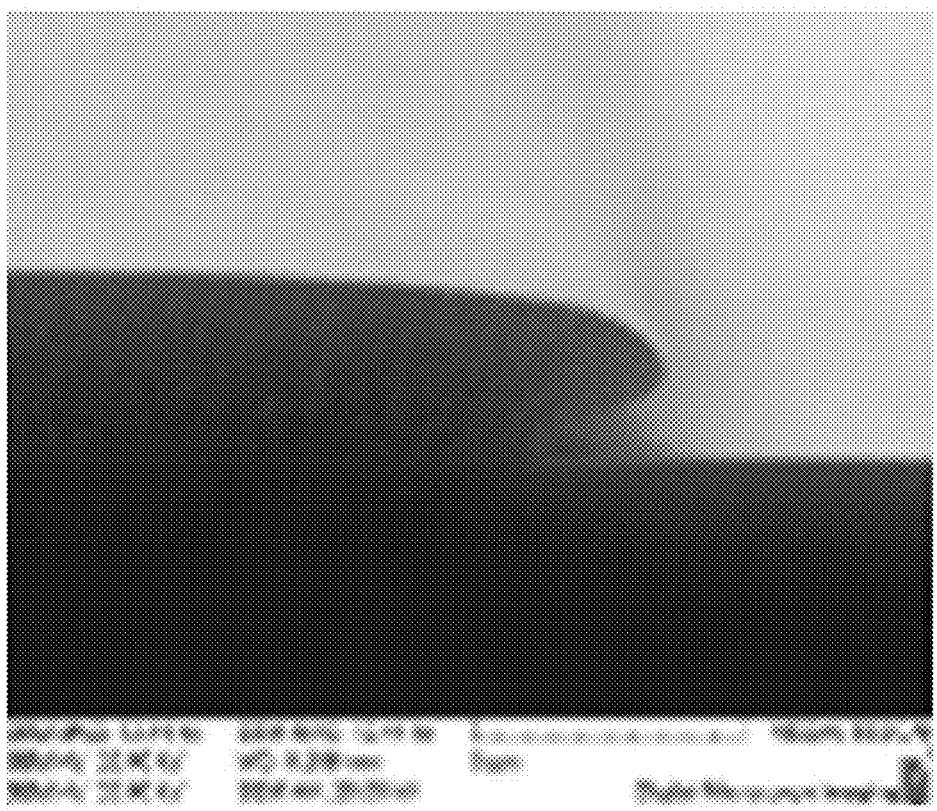
Figure 18:
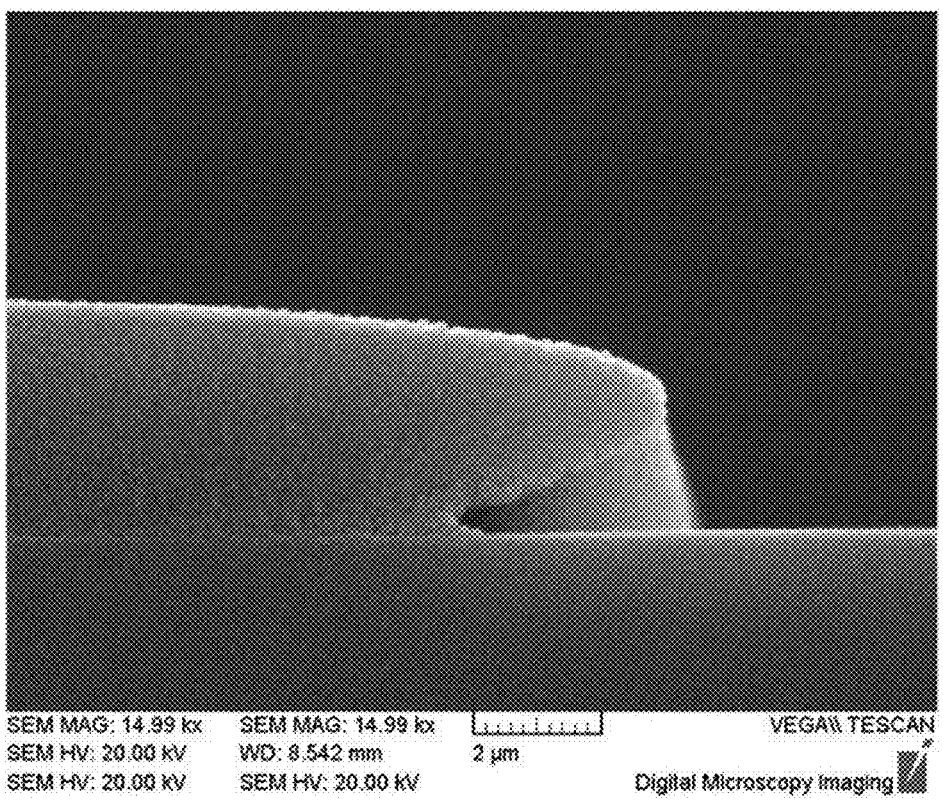
Figure 19:
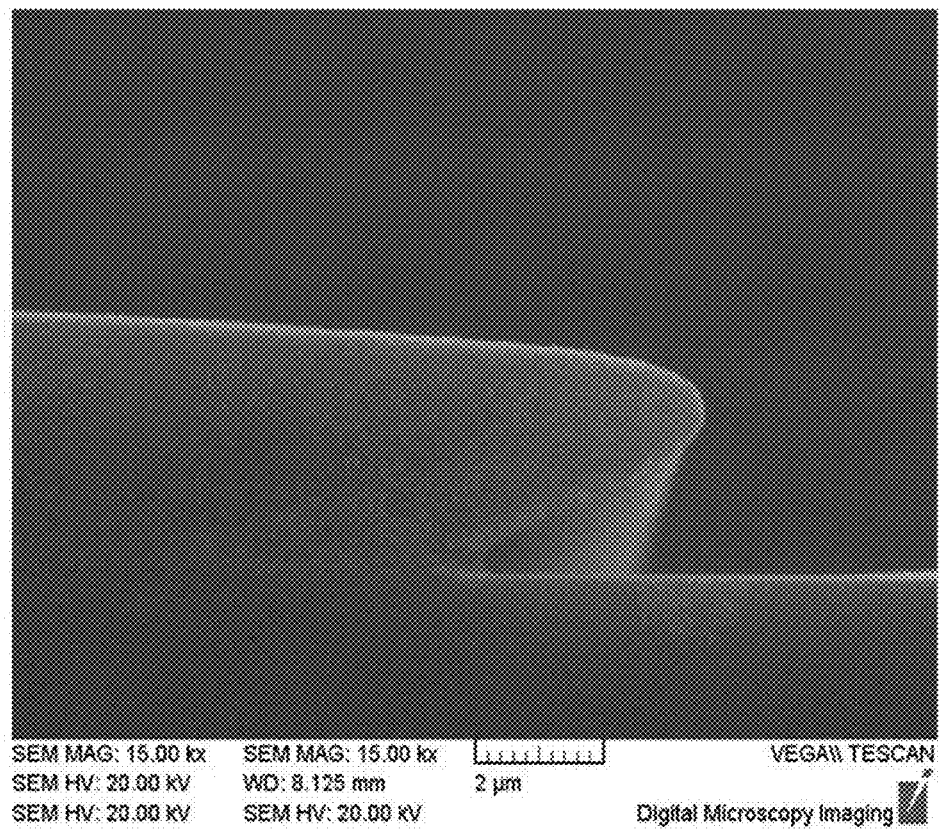
Figure 20:
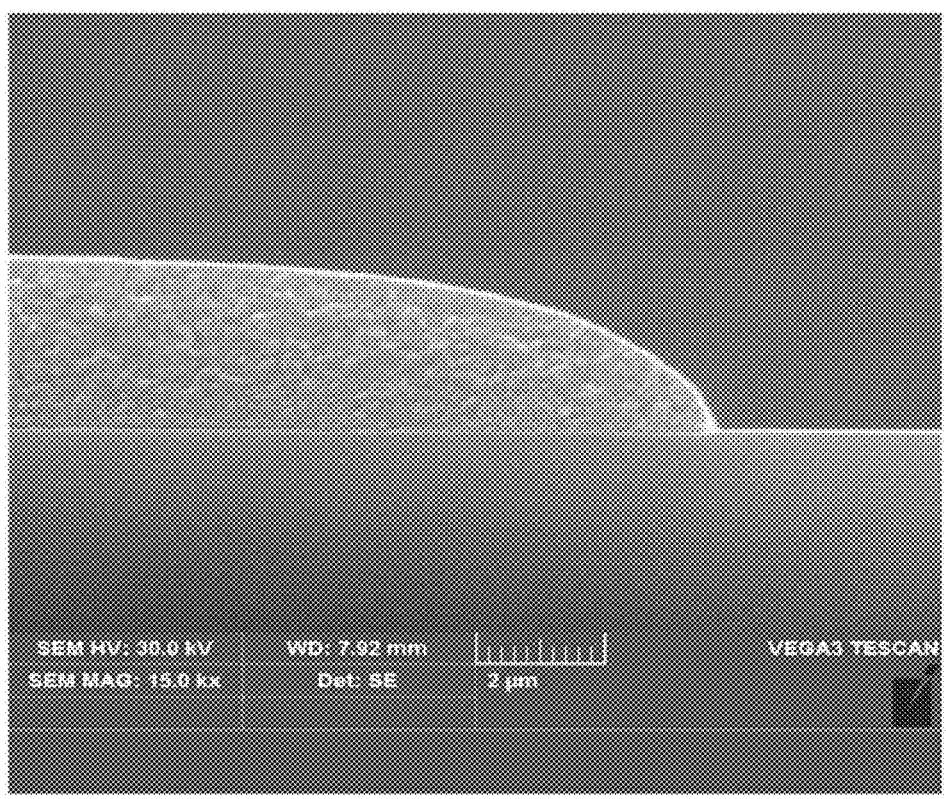

The photosensitive resin compositions according to Examples 1 to 4 and Comparative Examples 1 to 6 are respectively coated to be 0.8 μm thick on a silicon wafer (LG Siltron) with a spin coater (K-Spin8, KDNS) and exposed with 50 mJ for 350 ms by using an exposer (I10C, Nikon Co.). Subsequently, the exposed compositions are developed in a 0.2 wt % tetramethylammonium hydroxide (TMAH) aqueous solution with a developer (SSP-200, SVS) to form patterns, and then, the taper angles of the patterns are measured by using a scanning electron microscope, the scanning electron microscope images are examined with naked eyes to check whether the patterns had a wrinkle on the surface or not. The results are provided in Table 3 and FIGS. 1 to 20.

TABLE 3

|  | Wrinkle | Taper angle (°) |
|---|---|---|
| Example 1 | x | 66.50 |
| Example 2 | x | 60.47 |
| Example 3 | x | 51.32 |
| Example 4 | x | 41.26 |
| Comparative Example 1 | ○ | NG |
| Comparative Example 2 | ○ | NG |
| Comparative Example 3 | ○ | NG |
| Comparative Example 4 | ○ | NG |
| Comparative Example 5 | ○ | NG |
| Comparative Example 6 | ○ | 48.72 |

Wrinkle Evaluation x: no wrinkle when examined with the naked eye

○: wrinkle when examined with the naked eye

Referring to Table 3 and FIGS. 1 to 20, a pattern in a color filter formed by respectively using the photosensitive resin compositions according to Examples 1 to 4 has an appropriate taper angle ranging from 40° to 70° and shows no wrinkle compared with a pattern in a color filter formed by respectively using the photosensitive resin compositions according to Comparative Examples 1 to 6.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present invention in any way. Although specific terms are employed herein, they are used in a generic and descriptive sense only and not for purposes of limitation, the scope of the invention being defined in the claims.

What is claimed is:

1. A photosensitive resin composition, comprising:
   (A) a binder resin;
   (B) a photopolymerizable monomer;
   (C) a photopolymerization initiator;
   (D) a colorant; and
   (E) a solvent, wherein the binder resin comprises a first binder resin including structural units represented by Chemical Formulae 1 to 4, and the first binder resin is present in an amount of about 20 wt % to about 90 wt % based on the total weight of the binder resin:

[Chemical Formula 1]

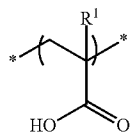

[Chemical Formula 2]

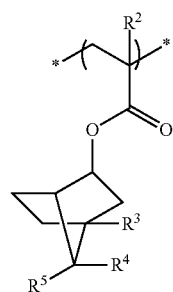

[Chemical Formula 3]

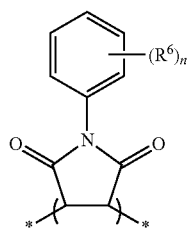

[Chemical Formula 4]

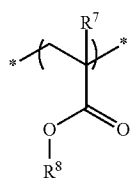

wherein, in Chemical Formulae 1 to 4, $R^1$, $R^2$, and $R^7$ are the same or different and are each independently a hydrogen atom or a substituted or unsubstituted C1 to C10 alkyl group, $R^3$ to $R^6$ are the same or different and are each independently a hydrogen atom, a substituted or unsubstituted C1 to C20 alkyl group, a substituted or unsubstituted C1 to C20 alkoxy group, a substituted or unsubstituted C6 to C20 aryl group, or a substituted or unsubstituted C6 to C20 aryloxy group, $R^8$ is a substituted or unsubstituted C12 to C20 alkyl group, and n is an integer ranging from 0 to 5.

2. The photosensitive resin composition of claim 1, wherein the first binder resin comprises:

about 10 to about 30 wt % of the structural unit represented by Chemical Formula 1;

about 10 to about 30 wt % of the structural unit represented by Chemical Formula 2;

about 5 to about 25 wt % of the structural unit represented by Chemical Formula 3; and about 35 to about 55 wt % of the structural unit represented by Chemical Formula 4, each based on the total weight of the first binder resin.

3. The photosensitive resin composition of claim 1, wherein the first binder resin has a weight average molecular weight of about 6,000 g/mol to about 10,000 g/mol.

4. The photosensitive resin composition of claim 1, wherein the first binder resin has an acid value of about 100 mgKOH/g to about 140 mgKOH/g.

5. The photosensitive resin composition of claim 1, wherein the binder resin further comprises a second binder resin, and the second binder resin includes a structural unit represented by Chemical Formula 1 and structural units represented by Chemical Formulae 5 to 8:

[Chemical Formula 5]

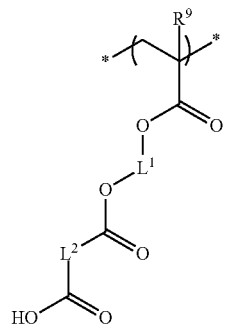

[Chemical Formula 6]

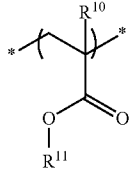

[Chemical Formula 7]

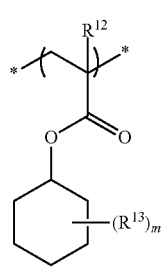

[Chemical Formula 8]

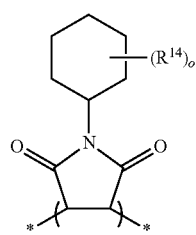

wherein in Chemical Formulae 5 to 8,
$R^9$, $R^{10}$, and $R^{12}$ are the same or different and are each independently a hydrogen atom or a substituted or unsubstituted C1 to C10 alkyl group,
$R^{11}$ is a substituted or unsubstituted C1 to C10 alkyl group,
$R^{13}$ and $R^{14}$ are the same or different and are each independently a hydrogen atom, a substituted or unsubstituted C1 to C20 alkyl group, a substituted or unsubstituted C1 to C20 alkoxy group, a substituted or unsubstituted C6 to C20 aryl group, or a substituted or unsubstituted C6 to C20 aryloxy group,
$L^1$ and $L^2$ are the same or different and are each independently a substituted or unsubstituted C1 to C10 alkylene group, and
m and o are the same or different and are each independently integers ranging from 0 to 5.

6. The photosensitive resin composition of claim 5, wherein the second binder resin is present in an amount of about 5 wt % to about 30 wt % based on the total weight of the binder resin.

7. The photosensitive resin composition of claim 5, wherein the second binder resin comprises:
about 10 to about 30 wt % of the structural unit represented by Chemical Formula 1;
about 5 to about 15 wt % of the structural unit represented by Chemical Formula 5;
about 10 to about 30 wt % of the structural unit represented by Chemical Formula 6;
about 30 to about 50 wt % of the structural unit represented by Chemical Formula 7; and
about 5 to about 15 wt % of the structural unit represented by Chemical Formula 8, each based on the total weight of the second binder resin.

8. The photosensitive resin composition of claim 5, wherein the binder resin comprises a third binder resin, wherein the third binder resin includes structural units represented by Chemical Formulae 9 to 11:

[Chemical Formula 9]

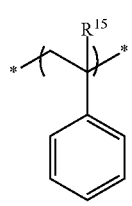

[Chemical Formula 10]

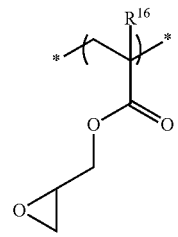

[Chemical Formula 11]

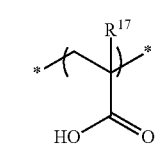

wherein in Chemical Formulae 9 to 11,
$R^{15}$ to $R^{17}$ are the same or different and are each independently a hydrogen atom or a substituted or unsubstituted C1 to C10 alkyl group.

9. The photosensitive resin composition of claim 8, wherein the third binder resin is present in an amount of about 10 wt % to about 50 wt % based on the total weight of the binder resin.

10. The photosensitive resin composition of claim 1, wherein the binder resin comprises a third binder resin, wherein the third binder resin includes structural units represented by Chemical Formulae 9 to 11:

[Chemical Formula 9]

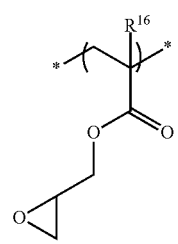

[Chemical Formula 10]

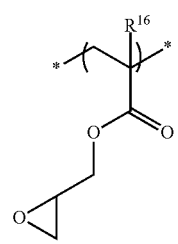

[Chemical Formula 11]

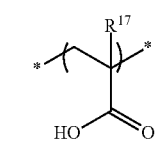

wherein in Chemical Formulae 9 to 11,
$R^{15}$ to $R^{17}$ are the same or different and are each independently a hydrogen atom or a substituted or unsubstituted C1 to C10 alkyl group.

11. The photosensitive resin composition of claim 10, wherein the third binder resin is present in an amount of about 10 wt % to about 50 wt % based on the total weight of the binder resin.

12. The photosensitive resin composition of claim 1, wherein the binder resin further comprises an epoxy-based binder resin.

13. The photosensitive resin composition of claim 12, wherein the epoxy-based binder resin is present in an amount of about 1 wt % to about 10 wt % based on the total weight of the binder resin.

14. The photosensitive resin composition of claim 12, wherein the epoxy-based binder resin has an epoxy equivalent weight ranging from about 150 g/eq to about 200 g/eq.

15. The photosensitive resin composition of claim 1, wherein the colorant comprises a dye, a pigment, or a combination thereof.

16. The photosensitive resin composition of claim 15, wherein the pigment comprises a green pigment, a yellow pigment, or a combination thereof.

17. The photosensitive resin composition of claim 1, wherein the photosensitive resin composition comprises:
(A) about 1 wt % to about 30 wt % of the binder resin;
(B) about 1 wt % to about 20 wt % of the photopolymerizable monomer;
(C) about 0.1 wt % to about 10 wt % of the photopolymerization initiator;
(D) about 10 wt % to about 40 wt % of the colorant; and
(E) a balance amount of the solvent,
each based on the total weight of the photosensitive resin composition.

18. The photosensitive resin composition of claim 1, wherein the photosensitive resin composition further comprises malonic acid; 3-amino-1,2-propanediol; a silane-based coupling agent having a vinyl group or a (meth) acryloxy group; a leveling agent; a fluorine-based surfactant; and/or a radical polymerization initiator.

19. A color filter using the photosensitive resin composition of claim 1.

* * * * *